US012812807B2

(12) United States Patent
Lee et al.

(10) Patent No.: US 12,812,807 B2
(45) Date of Patent: Nov. 24, 2026

(54) ELECTRONIC DEVICE AND ELECTRONIC DEVICE HOUSING STRUCTURE

(71) Applicant: SAMSUNG ELECTRONICS CO., LTD., Suwon-si (KR)

(72) Inventors: Heesung Lee, Suwon-si (KR); Goeun Kim, Suwon-si (KR); Inkyu Kim, Suwon-si (KR); Hyunsoo Kim, Suwon-si (KR); Hyesun Park, Suwon-si (KR); Kyunghwan Song, Suwon-si (KR); Aro Cheon, Suwon-si (KR); Youngjun Heo, Suwon-si (KR); Kyungtae Kim, Suwon-si (KR); Seokjin Park, Suwon-si (KR); Hyunsuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 712 days.

(21) Appl. No.: 18/115,467

(22) Filed: Feb. 28, 2023

(65) Prior Publication Data

US 2023/0209757 A1 Jun. 29, 2023

Related U.S. Application Data

(63) Continuation of application No. PCT/KR2021/011706, filed on Aug. 31, 2021.

(30) Foreign Application Priority Data

Aug. 31, 2020 (KR) ........................ 10-2020-0110390

(51) Int. Cl.
*G06F 1/16* (2006.01)
*C25D 11/12* (2006.01)
(Continued)

(52) U.S. Cl.
CPC ............... *H05K 5/04* (2013.01); *C25D 11/12* (2013.01); *C25D 11/14* (2013.01); *C25D 11/16* (2013.01);
(Continued)

(58) Field of Classification Search
CPC ......... C25D 11/12; C25D 11/14; C25D 11/16; C25D 11/18; H05K 5/04; H05K 5/0086
See application file for complete search history.

(56) References Cited

U.S. PATENT DOCUMENTS 10,461,452 B2 * 10/2019 Curran .................. G06F 1/1656
11,540,408 B2 * 12/2022 Browning ............. C25D 11/34
(Continued)

FOREIGN PATENT DOCUMENTS

CN 206462843 U 9/2017
CN 107683047 A 2/2018
(Continued)

OTHER PUBLICATIONS

Int. Search Report (PCT/ISA/210) dated Dec. 14, 2021 issued by the Int. Searching Authority in App. No. PCT/KR2021/011706.
(Continued)

*Primary Examiner* — Anthony M Haughton
(74) *Attorney, Agent, or Firm* — Sughrue Mion, PLLC

(57) ABSTRACT

In an embodiment, a housing for an electronic device is colored through an anodizing process. The electronic device includes the housing, which includes a front plate; a rear plate facing away from the front plate; a side member surrounding a space between the front plate and the rear plate; and a support member which is disposed in the space. A portion of the housing is a conductive member formed of an electrically conductive material, which is divided into a first portion and a second portion which is electrically isolated from the first portion. The first portion is colored by
(Continued)

a primary anodizing process with a first color, and the second portion is colored by a secondary anodizing process with a second color different from the first color.

20 Claims, 18 Drawing Sheets

(51) Int. Cl.

| | |
|---|---|
| ***C25D 11/14*** | (2006.01) |
| ***C25D 11/16*** | (2006.01) |
| ***C25D 11/18*** | (2006.01) |
| ***G04G 17/08*** | (2006.01) |
| ***H05K 5/00*** | (2025.01) |
| ***H05K 5/04*** | (2006.01) |
| ***H05K 7/00*** | (2006.01) |
| *H04M 1/02* | (2006.01) |

(52) U.S. Cl.
CPC ............. *C25D 11/18* (2013.01); *G04G 17/08* (2013.01); *H05K 5/0086* (2013.01); *H04M 1/026* (2013.01)

(56) References Cited

U.S. PATENT DOCUMENTS

| | | | | |
|---|---|---|---|---|
| 11,549,191 | B2 * | 1/2023 | Curran | C25D 11/243 |
| 2012/0267989 | A1 * | 10/2012 | Guan | B44C 1/26 156/154 |
| 2013/0075262 | A1 | 3/2013 | Teng | |
| 2013/0319865 | A1 | 12/2013 | Browning et al. | |
| 2013/0321237 | A1 * | 12/2013 | Woodhull | C25D 11/34 156/60 |
| 2014/0346049 | A1 | 11/2014 | Khosla | |
| 2015/0090597 | A1 * | 4/2015 | Tatebe | C25D 11/16 205/333 |
| 2016/0089834 | A1 | 3/2016 | Mag et al. | |
| 2016/0330852 | A1 * | 11/2016 | Browning | G03F 1/38 |
| 2017/0121838 | A1 * | 5/2017 | Tatebe | C25D 11/10 |
| 2017/0346164 | A1 * | 11/2017 | Kim | H04M 1/0266 |
| 2017/0347476 | A1 * | 11/2017 | Hwang | C25D 11/243 |
| 2018/0042130 | A1 * | 2/2018 | Li | H05K 5/0247 |
| 2018/0069951 | A1 | 3/2018 | Li et al. | |
| 2018/0343331 | A1 * | 11/2018 | Jaegal | H04M 1/0266 |
| 2019/0159355 | A1 * | 5/2019 | Baek | C25D 17/005 |
| 2019/0182974 | A1 | 6/2019 | Baek et al. | |
| 2020/0037460 | A1 | 1/2020 | Jeong et al. | |
| 2020/0198294 | A1 | 6/2020 | Lee et al. | |
| 2020/0264658 | A1 | 8/2020 | Seo et al. | |
| 2021/0037126 | A1 | 2/2021 | Yoo et al. | |
| 2021/0130974 | A1 | 5/2021 | Kim et al. | |
| 2022/0024815 | A1 | 1/2022 | Kim et al. | |

FOREIGN PATENT DOCUMENTS

| | | | |
|---|---|---|---|
| CN | 208002615 | U | 10/2018 |
| EP | 3 599 296 | A1 | 1/2020 |
| JP | 2007-2316 | A | 1/2007 |
| KR | 10-1568343 | B1 | 11/2015 |
| KR | 10-2016-0149792 | A | 12/2016 |
| KR | 10-1790522 | B1 | 10/2017 |
| KR | 10-2017-0134001 | A | 12/2017 |
| KR | 10-2018-0088157 | A | 8/2018 |
| KR | 10-2018-0104517 | A | 9/2018 |
| KR | 10-2019-0097553 | A | 8/2019 |
| KR | 10-2020-0012550 | A | 2/2020 |
| KR | 10-2020-0052215 | A | 5/2020 |
| KR | 10-2020-0099733 | A | 8/2020 |
| WO | 2020/013481 | A1 | 1/2020 |
| WO | 2020/122490 | A1 | 6/2020 |
| WO | 2020/159166 | A1 | 8/2020 |

OTHER PUBLICATIONS

Written Opinion (PCT/ISA/237) dated Dec. 14, 2021 issued by the Int. Searching Authority in App. No. PCT/KR2021/011706.
Communication issued Jul. 29, 2024 by the China National Intellectual Property Administration, PRC in Chinese Patent Application No. 202180053779.1.
Communication issued Aug. 12, 2024 by the Intellectual Property Office of India in Indian Patent Application No. 202317018493.
Communication dated Dec. 30, 2024 issued by the China National Intellectual Property Administration in Chinese Patent Application No. 202180053779.1.
Search Report issued on Jan. 8, 2024 by European Patent Office in European Application No. 21862166.2.
Extended European Search Report dated Oct. 16, 2025, issued by the European Patent Office in European Application No. 21862166.2.
Communication dated Mar. 28, 2025, issued by the China National Intellectual Property Administration in Chinese Application No. 202180053779.1.
Communication dated Apr. 22, 2024, issued by the Korean Patent Office in Korean Application No. 10-2020-0110390.
Communication dated Sep. 1, 2025, issued by the China National Intellectual Property Administration in Chinese Application No. 202180053779.1.
Communication dated Aug. 6, 2025, issued by Intellectual Property India in Indian Application No. 202317018493.

* cited by examiner

ELECTRONIC DEVICE AND ELECTRONIC DEVICE HOUSING STRUCTURE

CROSS-REFERENCE TO RELATED APPLICATIONS

This application is a continuation application of International Application No. PCT/KR2021/011706, filed on Aug. 31, 2021, which is based on and claims priority to Korean Patent Application No. 10-2020-0110390, filed on Aug. 31, 2020 in the Korean Intellectual Property Office, the disclosures of each of which are incorporated by reference herein in their entireties.

BACKGROUND

1. Field

The disclosure relates to an electronic device and an electronic device housing structure, and more particularly, to a housing structure having a plurality of different colors each applied to different portions of a member thereof, through a continuous anodizing process.

2. Description of Related Art

In line with development of information/communication technologies and semiconductor technologies, there has been widespread use of various kinds of electronic devices. Particularly, recent electronic devices have been developed to be portable and used for communication; such are frequently described as portable electronic devices, portable terminals, or mobile devices. Furthermore, electronic devices may output stored information as sounds or images. In line with the high degree of integration of electronic devices and the widespread use of super-fast large-capacity wireless communication, it has recently become possible to equip a single electronic device (for example, mobile communication terminal) with various functions. For example, a single electronic device may provide not only a communication function, but also functions for entertainment (for example, gaming), multimedia (for example, music/video playback), scheduling, security (for example, mobile banking), and other financial (for example, electronic wallets). Such electronic devices have become compact such that users can conveniently carry the same.

There has been ongoing research, in connection with fabricating a housing intended to constitute the exterior of an electronic device, for utilizing a metal material to provide various circuit devices and the like with protection from external environments and the conditions thereof, and also to provide an aesthetic appearance to the electronic device. With regard to the latter, in order to improve the aesthetic appeal of electronic devices, there have been increasing design-related demands for housings having various shapes or various colors.

SUMMARY

Provided are an electronic device and an electronic device housing structure, wherein differing colors are applied on a single housing through a secondary anodizing process performed continuously after a primary anodizing process.

According to an embodiment of the present disclosure, an electronic device may include a housing. The housing may include a front plate; a rear plate facing in a direction opposite to the front plate; a side member configured to surround a space between the front plate and the rear plate; and a support member disposed in the space A portion of the housing may be a conductive member formed of an electrically conductive material and divided into a first portion and a second portion electrically separated from the first portion. The first portion may be colored by a primary anodizing process with a first color and the second portion may be colored by a secondary anodizing process with a second color different from the first color.

According to an embodiment of the present disclosure, a housing manufacturing method may include: providing a housing including a metal member, which includes a first portion and a second portion electrically separated from the first portion; primary anodizing to form a first oxide film on the first portion of the metal member; coloring and treating the first oxide film formed on the first portion by using a coloring material or colorant having a first color; secondary anodizing process of forming a second oxide film on the second portion of the metal member; and coloring and treating the second oxide film formed on the second portion by using a coloring material or colorant having a second color.

According to an embodiment of the present disclosure, a housing may include a conductive member formed of an electrically conductive material and divided into a first portion and a second portion electrically separated from the first portion. The first portion may be colored by a primary anodizing process with a first color and the second portion may be colored by a secondary anodizing process with a second color different from the first color.

According to an embodiment of the present disclosure, an electronic device may include a housing. The housing may include a front plate; a rear plate facing in a direction opposite to the front plate; a side member configured to surround a space between the front plate and the rear plate; and a support member disposed in the space. A portion of the housing may be divided into a first portion formed of an electrically conductive material and a second portion formed of an electrically conductive material and electrically separated from the first portion. The first portion may include a first outer wall which is colored with a (1-1)th color and faces the outside of the housing, and a first inner wall which is colored with a (1-2)th color and faces in a direction opposite to the first outer wall. The second portion may include a second outer wall which is colored with a (2-1)th color and faces the outside of the housing, and a second inner wall which is colored with a (2-2)th color and faces in a direction opposite to the second outer wall.

An electronic device according to an embodiment disclosed herein is advantageous in that, for example, the outer wall and inner wall of the electronic device may be colored with a plurality of differing colors, thereby implementing differentiated exterior design.

Also, an embodiment disclosed herein may provide a method for performing anodizing continuously without a need for complicated processes such as additional processing, polishing, or mashing, thereby reducing costs and improving productivity.

Also, an embodiment disclosed herein may provide a method including a continuous anodizing process applicable not only to the exterior frame of a portable electronic device, but also to a variety of other products having metal exterior materials.

The disclosed embodiments are not limited to providing the above-mentioned advantages, and may be expanded or modified in various manners without deviating from the idea and scope of the disclosure. Additional aspects will be set forth in part in the description that follows and, in part, will be apparent from the description, or may be realized by practice of the presented embodiments of the disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
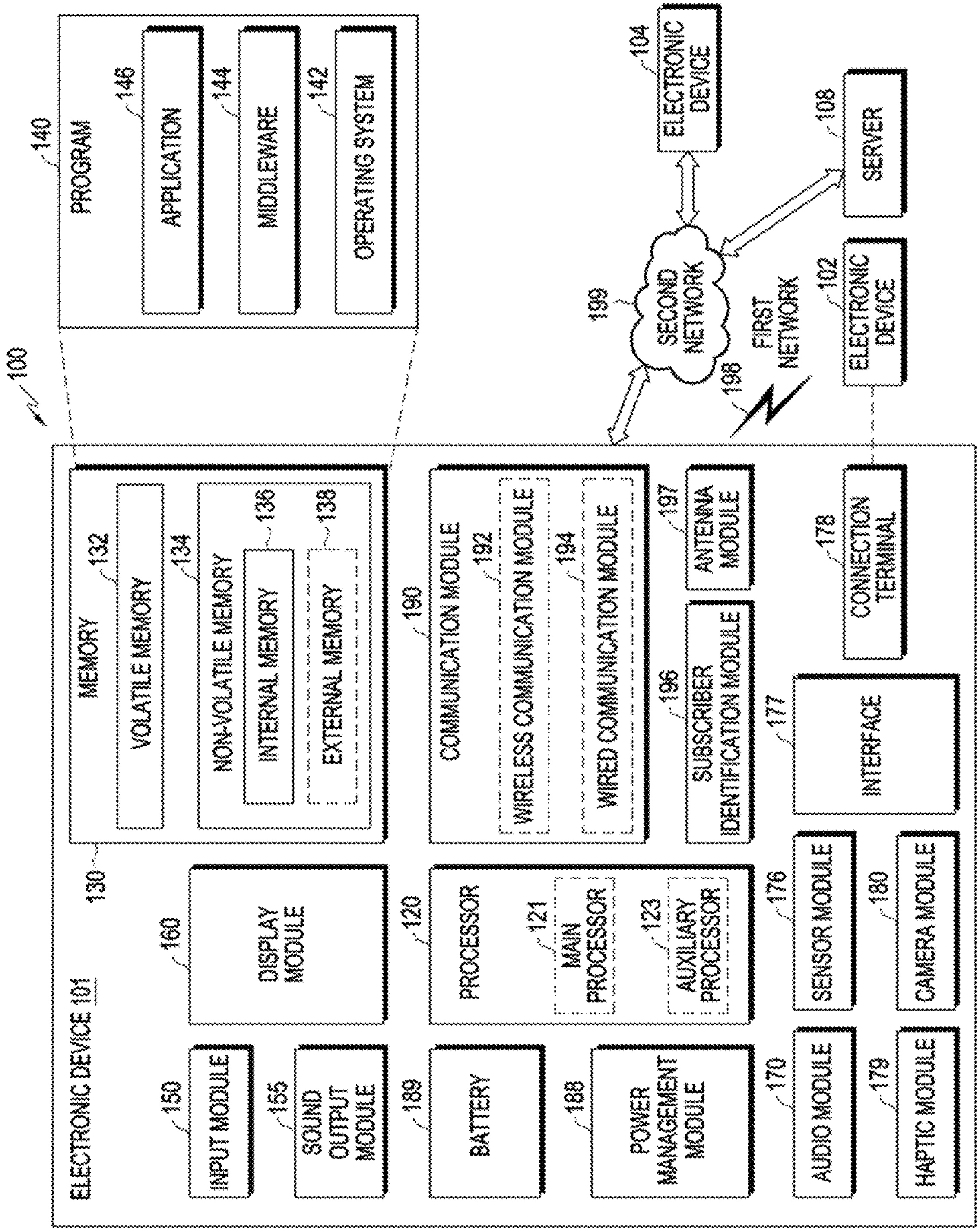
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to an embodiment may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Metal, and more particularly aluminum, may be used as the exterior material of a portable electronic device. In order to use aluminum as the exterior material of an electronic device, manufacturing processes may include a cutting process, an injection process, and a surface treatment process. For example, in the cutting process, the metal exterior material may be formed into a desired shape by using cutting machines (for example, CNC, diamond cut, polishing). In the injection process, synthetic resin melted at a high temperature may be injected into a metal exterior material component prepared in a mold such that the resin and the metal are bonded. For example, in the surface treatment process, anodizing may be used. During anodizing, a metal is electrically connected to the anode and is oxidated together with oxygen such that the surface of the metal is treated with the generated aluminum oxide film. An anodized surface is hard and anti-corrosive. Additionally, the film may provide coloring to the surface.

As noted in the Background, it is desirable to provide aesthetic appeal to a device through the housing design and features, for instance through color. In this, a housing with a plurality of differently colored sections would provide greater options for design and personal aesthetic choices. However, it is presently difficult to apply two or more colors to a single electronic device, as a large number of complicated processes may be involved.

In one approach, when two colors are to be applied to a single electronic device, a film may be formed through primary anodizing to apply the first color, a coloring process may be performed regarding the first color, and sealing may be performed regarding the same. In order to apply the second color, the section to be colored with different colors may be cut or polished to remove the primary anodizing film, another film may be formed through secondary anodizing, and a coloring process may be performed regarding the second color.

In another approach, after partially making an electronic device, primary anodizing, coloring, and sealing may be performed. After removing the mask, an oxide film may be formed through secondary anodizing, and secondary coloring may be performed.

According to the above-mentioned embodiments, the primary film having the first color may be damaged during the cutting or polishing process, thereby affecting the product quality and durability, and the processes may be complicated and may require a long time. Also, manufacturing costs may be increased by the masking and demasking processes, and a rate of defective products may depend on the accuracy of masking.

Figure 2:
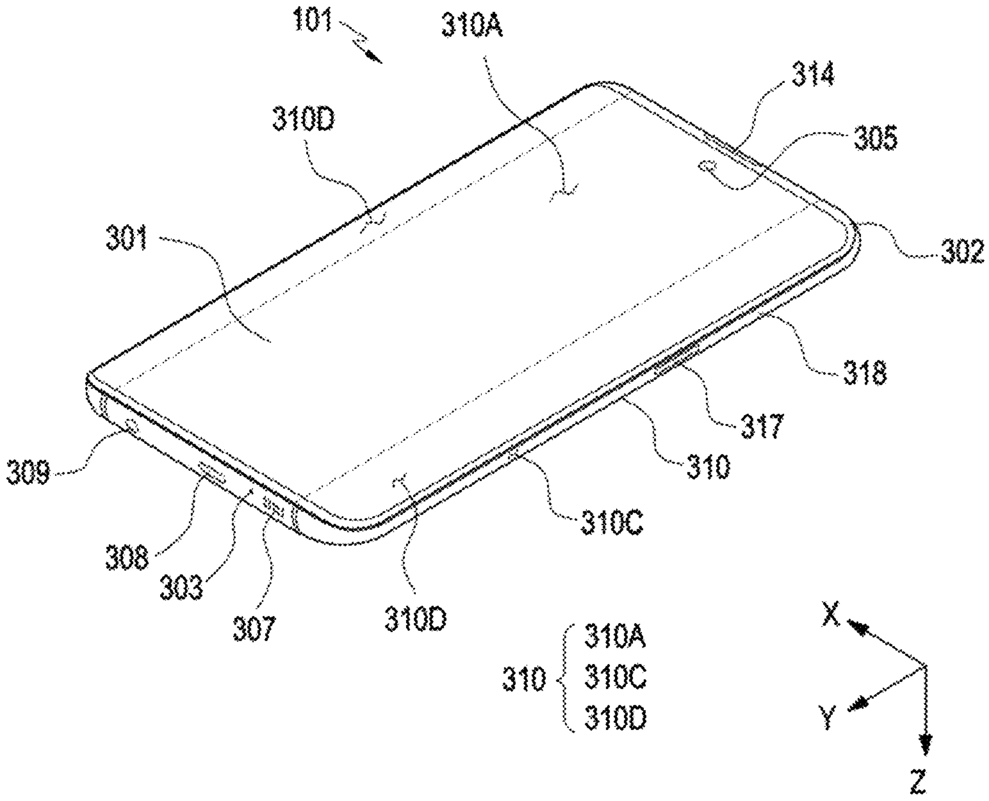
FIG. 2 is a front perspective view of an electronic device according to an exemplary embodiment.
Figure 3:
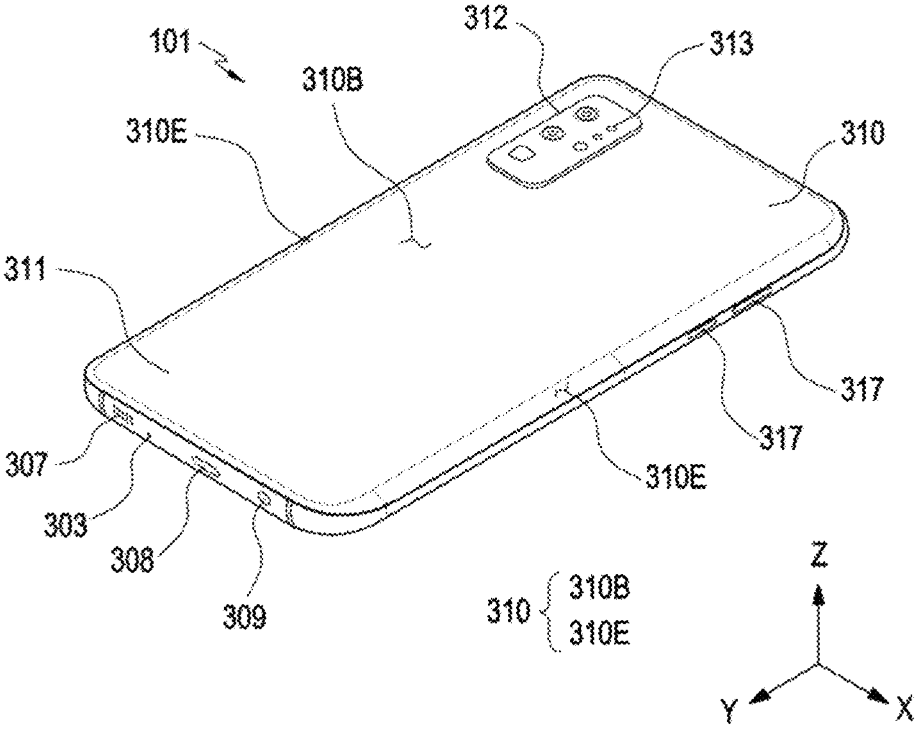
FIG. 3 is a rear perspective view of an electronic device according to an exemplary embodiment.

FIG. 2 is a front perspective view of an electronic device according to an exemplary embodiment. FIG. 3 is a rear perspective view of an electronic device according to an exemplary embodiment.

Referring to FIG. 2 and FIG. 3, an electronic device 101 according to an embodiment may include a housing 310, and the housing may include a front surface 310A, a rear surface 310B, and a side surface 310C for surrounding a space between the front surface 310A and the rear surface 310B. In another embodiment (not shown), the housing 310 may also be referred to as a structure which forms or defines a portion of the front surface 310A in FIG. 2, and the rear surface 310B and the side surface 310C in FIG. 3. According to an embodiment, the front surface 310A may be formed by a front plate 302 (e.g., a glass plate including various coating layers, or a polymer plate) of which at least a portion is substantially transparent. The rear surface 310B may be formed by a rear plate 311. For example, the rear plate 311 may be formed of glass, ceramic, polymer, metal (e.g., aluminum, stainless steel (STS), or magnesium), or a combination of at least two of the above materials. The side surface 310C may be coupled to the front plate 302 and the rear plate 311, and may be formed by a side bezel structure (or "a side member") 318 including metal and/or polymer. In some embodiments, the rear plate 311 and the side bezel structure 318 may be integrally formed, and may include the same material (e.g., glass, a metal material such as aluminum, or ceramic).

In the illustrated embodiment, the front plate 302 may include two first edge areas 310D which are bent from the front surface 310A toward the rear plate 311 so as to extend seamlessly, and provided at opposite long edge ends of the front plate 302. In the illustrated embodiment (see FIG. 3), the rear plate 311 may include two second edge areas 310E which are bent from the rear surface 310B toward the front plate 302 so as to extend seamlessly, and provided at opposite long edge ends thereof. In some embodiments, the front plate 302 (or the rear plate 311) may include only one of the first edge areas 310D (or the second edge areas 310E). In another embodiment, a portion of the first edge areas 310D or the second edge areas 310E may not be included therein. In the embodiments, when seen from the side surface of the electronic device 101, the side bezel structure 318 may have a first thickness (or width) in the side of the side surface not including the first edge areas 310D or the second edge areas 310E, and may have a second thickness thinner than the first thickness in the side of the side surface including the first edge areas 310D or the second edge areas 310E. The side bezel structure 318 may taper from the first thickness to the second thickness.

According to an embodiment, the electronic device 101 may include at least one of a display 301, audio modules 303, 307, and 314 (e.g., the audio module 170 in FIG. 1), a sensor module (e.g., the sensor module 176 in FIG. 1), camera modules 305, 312, and 313 (e.g., the camera module 180 in FIG. 1), a key input device 317 (e.g., the input module 150 in FIG. 1), and connector holes 308 and 309 (e.g., the connecting terminal 178 in FIG. 1). In other embodiments, at least one (e.g., the connector hole 309) of the above elements may be omitted from the electronic device 101, and other components may be additionally included therein.

According to an embodiment, for example, the display 301 may be visually exposed through a significant portion of the front plate 302. In some embodiments, at least a portion of the display 301 may be exposed through the front surface 310A and the front plate 302 forming the first edge areas 310D. In some embodiments, the corners of the display 301 may be formed to have shapes substantially the same as the shapes of the outer perimeters of the front plate 302, which are adjacent thereto. In another embodiment (not shown), in order to expand an area which allows the display 301 to be exposed, there may be no gap between the outer perimeter of the display 301 and the outer perimeter of the front plate 302.

According to an embodiment, a surface (or the front plate 302) of the housing 310 may include a screen display area formed as the display 301 is visually exposed. As an example, the screen display area may include the front surface 310A and the first edge areas 310D.

In another embodiment (not shown), a recess or an opening may be formed in a portion of the screen display area (e.g., the front surface 310A or the first edge areas 310D) of the display 301, and at least one of the audio module 314, a sensor module (not shown), a light-emitting element (not shown), and the camera module 305 which are aligned with the recess or the opening may be included therein. In another embodiment (not shown), at least one of the audio module 314, a sensor module (not shown), the camera module 305, a fingerprint sensor (not shown), and a light-emitting element (not shown) may be included on the rear surface of the screen display area of the display 301.

In another embodiment (not shown), the display 301 may be coupled to or disposed adjacent to a touch detection circuit, a pressure sensor capable of measuring the intensity (pressure) of touch, and/or a digitizer for detecting a magnetic field-type stylus pen.

In some embodiments, at least a portion of the key input device 317 may be disposed in the first edge areas 310D and/or the second edge areas 310E.

According to an embodiment, for example, the audio modules 303, 307, and 314 may include a microphone hole 303 and speaker holes 307 and 314. A microphone for obtaining external sound may be disposed in the microphone hole 303, and in some embodiments, a plurality of microphones may be arranged to be able to detect the direction of sound. The speaker holes 307 and 314 may include an external speaker hole 307 for media and the like, and a short-range speaker hole 314 for phone calls. In some embodiments, the speaker holes 307 and 314 and the microphone hole 303 may be implemented as one hole, or a speaker (e.g., a piezo speaker) may be included therein without the speaker holes 307 and 314. The audio modules 303, 307, and 314 are not limited to the described structure, and a structure thereof may be modified in various ways such that, for example, only some of the described audio modules are included, or one or more additional audio modules are included, in a structure of the electronic device 101.

According to an embodiment, for example, a sensor module (not shown) may generate an electrical signal or a data value corresponding to an internal operation state of the electronic device 101 or an external environmental state. For example, a sensor module (not shown) may include a first sensor module (not shown) (e.g., a proximity sensor) and/or a second sensor module (not shown) (e.g., a fingerprint sensor) disposed on the front surface 310A of the housing 310, and/or a third sensor module (not shown) (e.g., an HRM sensor) and/or a fourth sensor module (not shown) (e.g., a fingerprint sensor) disposed on the rear surface 310B of the housing 310. In some embodiments (not shown), the fingerprint sensor may be disposed on the rear surface 310B as well as the front surface 310A (e.g., the display 301) of the housing 310. The electronic device 101 may further include other sensor modules not illustrated: for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (not shown). The sensor module (not shown) is not limited to the described structure, and a structure thereof may be modified in various ways such that, for example, only some of the described sensor modules are included, or one or more additional sensor modules are included, in a structure of the electronic device 101.

According to an embodiment, for example, the camera modules 305, 312, and 313 may include a front camera module or front image sensor 305 disposed on the front surface 310A of the electronic device 101, and a rear camera module or rear image sensor 312 and/or a flash 313 disposed on the rear surface 310B. The camera modules 305 and 312 each may include one lens or a plurality of lenses, an image sensor, and/or an image signal processor. The flash 313 may include a light-emitting diode or a xenon lamp. In some embodiments, two or more lenses (an infrared camera, a wide-angle lens, and a telephoto lens) and image sensors may be arranged on one surface of the electronic device 101. The camera modules 305, 312, and 313 are not limited to the described structure, and a structure thereof may be modified in various ways such that, for example, only some of the described camera modules are included, or one or more additional camera modules are included, in a structure of the electronic device 101.

According to an embodiment, the electronic device 101 may include a plurality of camera modules (e.g., a dual camera or a triple camera) having different properties (e.g., a view angle) or functions. For example, the camera modules 305 and 312 may be configured as a plurality of camera modules each providing lenses with different view angles, and the electronic device 101 may control to change a view angle of the camera modules 305 and 312, which is performed in the electronic device 101, based on a user selection. For example, one of the camera modules 305 and 312 may be a wide-angle camera, and the other thereof may be a telephoto camera. Similarly thereto, one of the camera modules 305 and 312 may be a front camera, and the other thereof may be a rear camera. In addition, the camera modules 305 and 312 may include at least one of a wide-angle camera, a telephoto camera, or an infrared (IR) camera (e.g., a time of flight (TOF) camera or a structured light camera). According to an embodiment, the IR camera may also operate as at least a portion of a sensor module. For example, the TOF camera may also operate as at least a portion of a sensor module (not shown) for detecting a distance to a subject.

According to an embodiment, the key input device 317 may be disposed on the side surface 310C of the housing 310. In another embodiment, the electronic device 101 may not include a portion or the whole of key input device 317 mentioned above, and the key input device 317 not included therein may be implemented as a different type such as a soft key, on the display 301. In some embodiments, the key input device may include a sensor module (not shown) disposed on the rear surface 310B of the housing 310.

According to an embodiment, for example, a light-emitting element (not shown) may be disposed on the front surface 310A of the housing 310. For example, the light-emitting element (not shown) may provide state information of the electronic device 101 in the form of light. In another embodiment, for example, the light-emitting element (not shown) may provide a light source operating in association with an operation of the front camera module 305. For example, the light-emitting element (not shown) may include an LED, an IR LED, and/or a xenon lamp.

According to an embodiment, for example, the connector holes 308 and 309 may include a first connector hole 308 capable of accommodating a connector (for example, a USB connector) for transmitting or receiving power and/or data to or from an external electronic device, and/or a second connector hole 309 (for example, an earphone jack) capable of accommodating a connector for transmitting or receiving audio signals to or from an external electronic device. The connector holes 308 and 309 are not limited to the described structure, and a structure thereof may be may be modified in various ways such that, for example, only some of the described connector holes are included, or one or more additional connector holes are included, in a structure of the electronic device 101.

According to an embodiment, the camera module 305 and/or the sensor module (not shown) may be disposed so as to be in contact with an external environment through a designated area of the display 301 and the front plate 302, in an inner space of the electronic device 101. For example, the designated area may be an area of the display 301, in which pixels are not arranged. As another example, the designated area may be an area of the display 301, in which pixels are arranged. When seen from above the display 301, at least a portion of the designated area may overlap the camera module 305 and/or sensor modules. As another example, some sensor modules may also be arranged to perform the function thereof without being visually exposed through the front plate 302 in the inner space of the electronic device.

Figure 4:
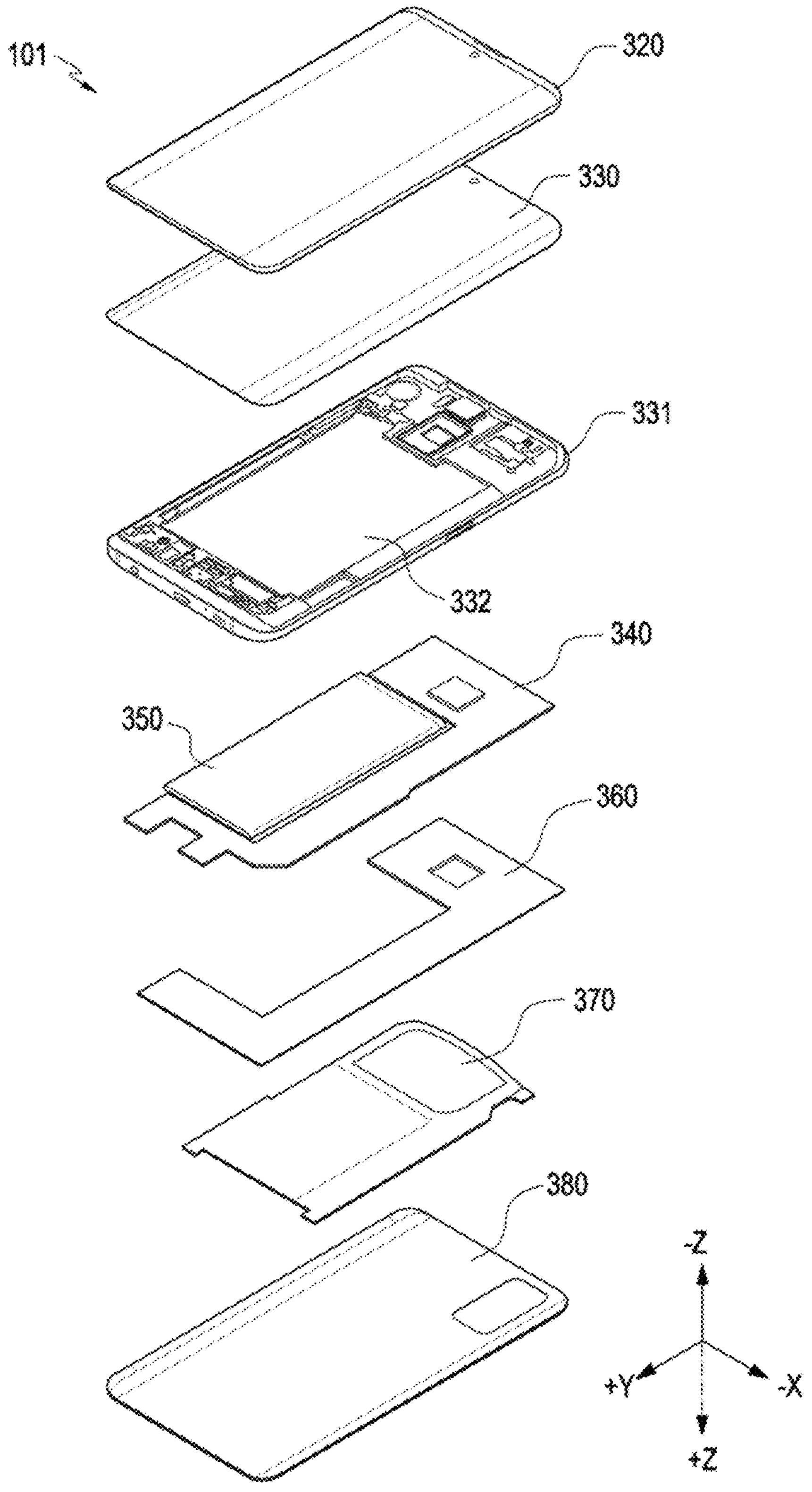
FIG. 4 is an exploded perspective view of an electronic device according to an exemplary embodiment.

FIG. 4 is an exploded perspective view of an electronic device according to an exemplary embodiment.

Referring to FIG. 4, an electronic device 101 (e.g., the electronic device 101 in FIG. 2 and FIG. 3) may include a front plate 320 (e.g., the front plate 302 in FIG. 2), a display 330 (e.g., the display 301 in FIG. 2), a first support member 332 (e.g., a bracket), a main printed circuit board 340 (e.g., a PCB, a flexible PCB (FPCB), or a rigid flexible PCB (RFPCB)), a battery 350, a second support member 360 (e.g., a rear case), an antenna 370, and a rear plate 380 (e.g., the rear plate 311 in FIG. 3). In other embodiments, at least one (e.g., the first support member 332 or the second support member 360) of the above elements may be omitted from the electronic device 101, or other elements may be additionally included therein. At least one of elements of the electronic device 101 may be the same as or similar to at least one of elements of the electronic device 101 in FIG. 2 or FIG. 3, and overlapping descriptions will be omitted hereinafter.

According to an embodiment, the first support member 332 may be disposed inside the electronic device 101 to be connected to a side bezel structure 331 or to be integrally formed with the side bezel structure 331. For example, the first support member 332 may be formed of a metal material and/or a non-metal (e.g., polymer) material. The display 330 may have one surface to which the first support member 332 is coupled, and the other surface to which the printed circuit board 340 is coupled. The printed circuit board 340 may have a processor, a memory, and/or an interface mounted thereon. For example, the processor may include one or more of a central processing unit, an application processor, a graphic processing device, an image signal processor, a sensor hub processor, or a communication processor. According to an embodiment, the printed circuit board 340 may include a flexible printed circuit board type radio frequency cable (FRC). For example, the printed circuit board 340 may be disposed on at least a portion of the first support member 332, and an antenna module (e.g., the antenna module 197 in FIG. 1) and a communication module (e.g., the communication module 190 in FIG. 1) may be electrically connected.

According to an embodiment, for example, the memory may include a volatile memory or a non-volatile memory.

According to an embodiment, for example, the interface may include a high-definition multimedia interface (HDMI), a universal serial bus (USB) interface, an SD card interface, and/or an audio interface. For example, the interface may electrically or physically connect the electronic device 101 to an external electronic device, and may include a USB connector, an SD card/MMC connector, or an audio connector.

According to an embodiment, the battery 350 may be a device for supplying power to at least one element of the electronic device 101, and for example, may include a non-rechargeable primary cell, a rechargeable secondary cell, or a fuel cell. For example, at least a portion of the battery 350 may be disposed on substantially the same plane as the printed circuit board 340. The battery 350 may also be integrally disposed inside the electronic device 101, or may be disposed to be detachable/attachable from/to the electronic device 101.

According to an embodiment, the second support member 360 (e.g., a rear case) may also be disposed between the printed circuit board 340 and the antenna 370. For example, the second support member 360 may also include one surface to which at least one of the printed circuit board 340 or the battery 350 is coupled, and the other surface to which the antenna 370 is coupled.

According to an embodiment, the antenna 370 may also be disposed between the rear plate 380 and the battery 350. For example, the antenna 370 may include a near field communication (NFC) antenna, a wireless charging antenna, and/or a magnetic secure transmission (MST) antenna. For example, the antenna 370 may perform short-range communication with an external device, or may transmit or receive power required for charging wirelessly. For example, the antenna 370 may include a coil for wireless charging. In another embodiment, an antenna structure may be formed by a portion of the side bezel structure 331 and/or the first support member 332, or a combination thereof.

According to an embodiment, the rear plate 380 may form at least a portion of the rear surface (e.g., the rear surface 310B in FIG. 3) of the electronic device 101.

The electronic device 101 illustrated in FIG. 2 to FIG. 4 is a mobile electronic device having a bar-type or a plate-type exterior. Throughout the disclosure, further references to electronic devices will continue to assume such a device for convenience and clarity purposes. However, this is intended as an example, and the disclosure and its embodiments are by no means limited thereto.

For example, in various undepicted embodiments, the electronic device may be a portion of a rollable electronic device or a foldable electronic device. A "rollable electronic device" may mean an electronic device in which a display (e.g., the display 330 in FIG. 4) may be bent and transformed so that at least a portion thereof is wound (or rolled), or is accommodated in a housing (e.g., the housing 310 in FIG. 2). According to needs of a user, the rollable electronic device may have a display which is unfoldable or has a larger area exposed to the outside, so as to expand and use a screen display area. A "foldable electronic device" may mean an electronic device in which two different areas of a display can be folded to face each other or to be oriented in directions opposite to each other. Generally, in a carrying state, a display of a foldable electronic device may be configured such that two different areas thereof are folded in a state of facing each other or in opposite directions, and in an actual use state, the display, by a user, may be unfolded such that the two different areas thereof form a substantially flat-plate shape.

Furthermore, in some embodiments, the electronic device disclosed and discussed herein need not be a handheld mobile electronic device such as a smartphone at all, but may be one of a variety of other types and forms of electronic devices, including but not limited to a notebook computer, a desktop computer or computer component (e.g., a monitor or screen, processor "tower," printer, or peripheral), a home appliance, or any other device for which a metal housing is suitable.

Figure 5:
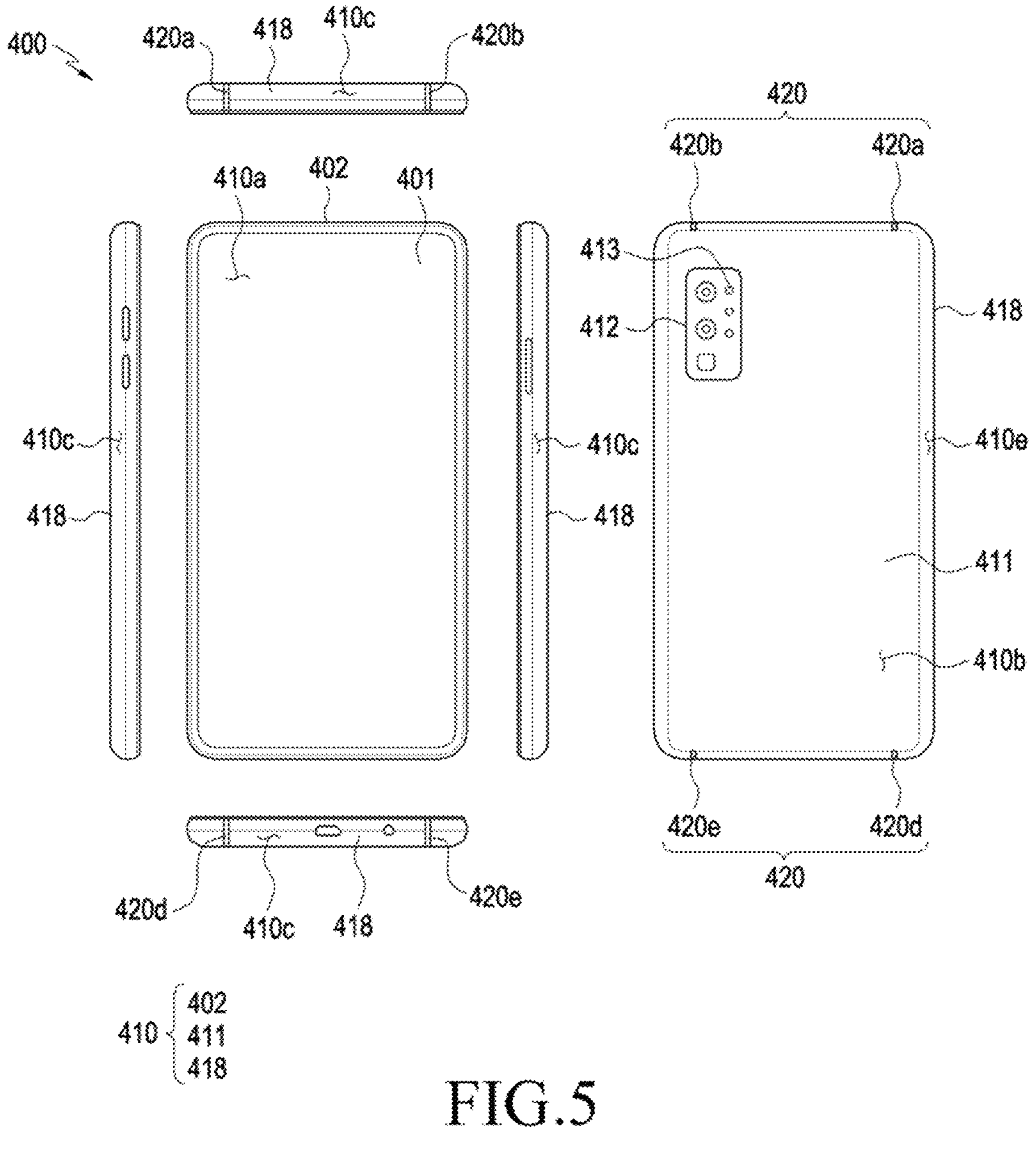
FIG. 5 is a series of views of a front surface, side surfaces, and a rear surface of an electronic device according to an exemplary embodiment.
Figure 6A:
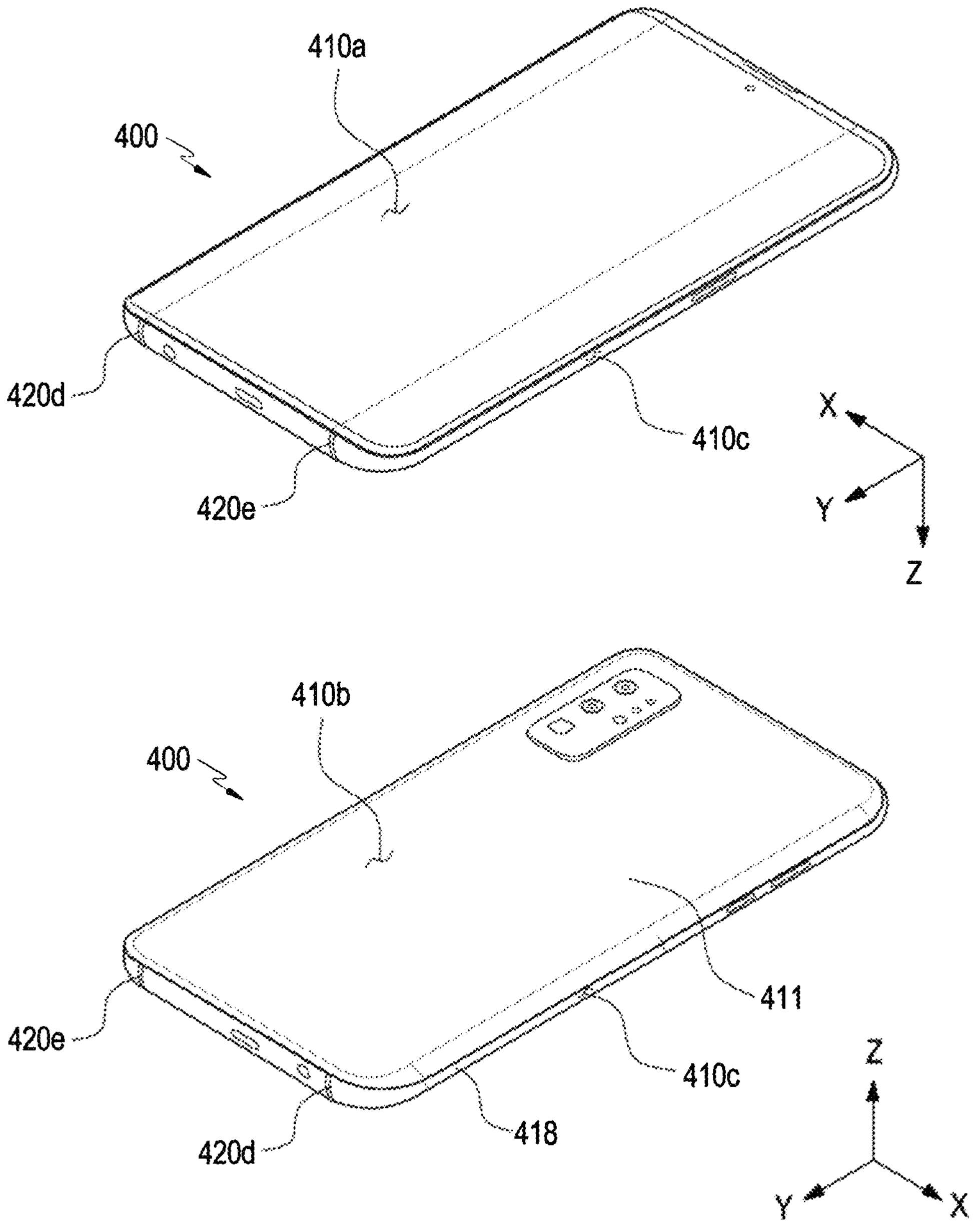
FIG. 6A is a series of perspective views of a front surface and the rear surface of an electronic device according to another exemplary embodiment.
Figure 6B:
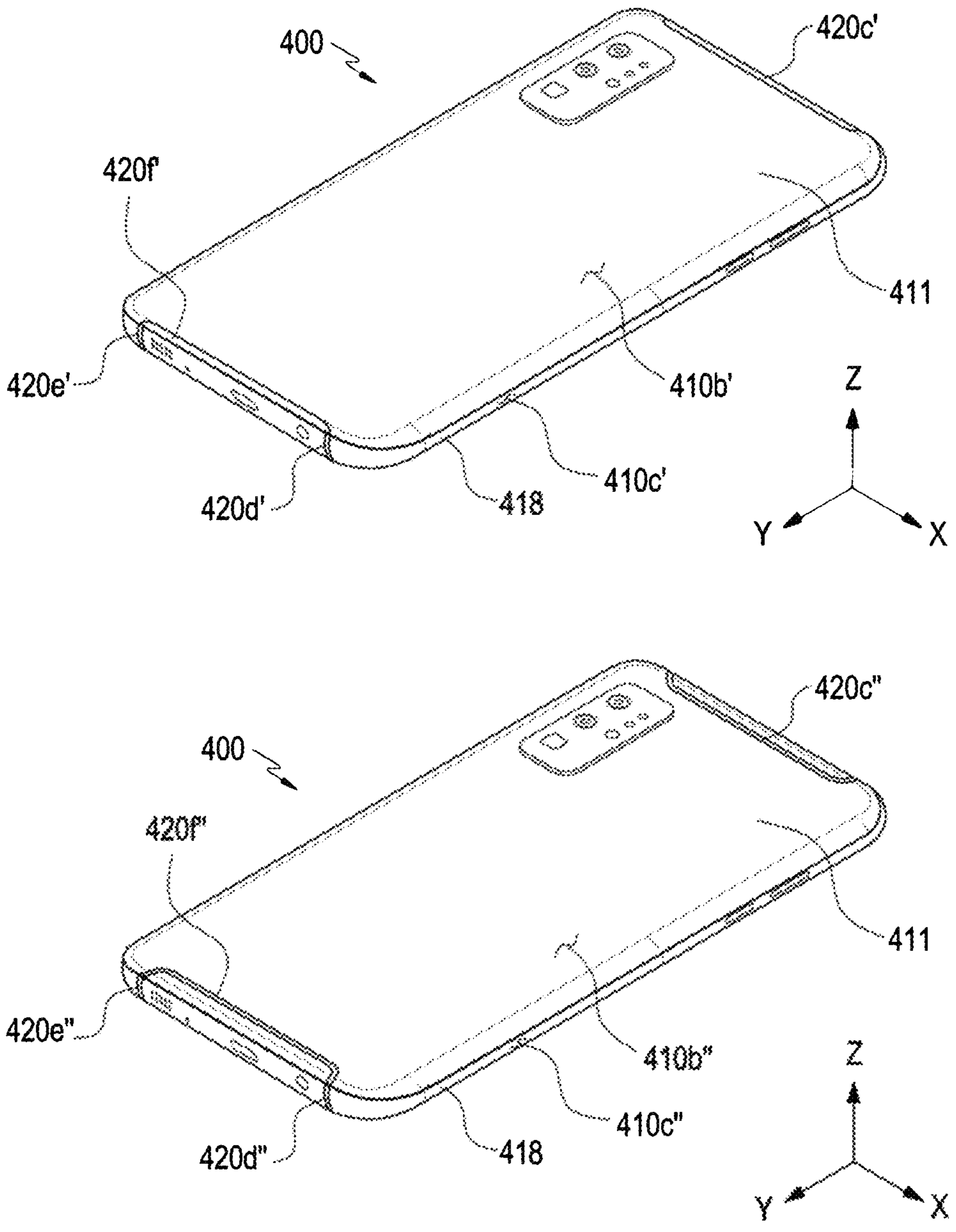
FIG. 6B is a series of perspective views of the rear surface of an electronic device according to various exemplary embodiments.

FIG. 5 is a series of views of a front surface 410*a,* side surfaces 410*c,* and a rear surface 410*b* of an electronic device 400 according to an exemplary embodiment. FIG. 6A is a series of perspective views showing the front surface 410*a* and the rear surface 410*b* of an electronic device (e.g., 400 in FIG. 5) according to another exemplary embodiment. FIG. 6B is a series of perspective views showing the rear surface (410*b*' and 410*b*") of an electronic device (e.g., 400 in FIG. 5) according to various exemplary embodiments.

Referring to FIG. 5, an electronic device 400 (e.g., the electronic device 101 or 300) according to an embodiment may include a housing 410, and the housing may include a front plate 402 (e.g., the front plate 302 or 320); a rear plate 411 (e.g., the rear plate 311 or 380) oriented in a direction opposite to the front plate 402; and a side member 418 (e.g., the side bezel structure 318 or 310) surrounding a space between the front plate 402 and the rear plate 411, and a display 401 (e.g., the display 301 or 330) may be visually exposed through the front plate 402.

According to an embodiment, the housing 410 may further include (or define) a first surface 410*a* (or a front surface) formed by the front plate 402, a second surface 410*b* (or a rear surface) formed by the rear plate 411, and third surfaces 410*c* (or side surfaces) formed by the side member 418. According to an embodiment, the first surface 410*a* and the second surface 410*b* may be oriented in different directions, and the third surfaces 410*c* may be perpendicular to each of the first surface 410*a* and the second surface 410*b*.

According to an embodiment, the third surfaces 410*c* formed by the side member 418 may have four surfaces corresponding to the shapes of the edge of the rear plate 411, and the four surfaces may be oriented in directions different from each other.

According to an embodiment, at least one of the first surface 410*a,* the second surface 410*b,* and the third surfaces 410*c* may be configured to include a curved surface.

According to an embodiment, at least one slit 420 may be formed in the side member 418. The at least one slit 420 formed in the side member 418 may be for using at least a portion of the side member 418 as an antenna. In an embodiment, the slits 420 may be formed to isolate and segment at least a portion of the side member 418 from other portions of the side member 418. The number of the slits 420 or the shape of the slit 420 is not limited to any specified embodiment. In addition, the use of the slits 420 need not be for utilizing at least a portion of the side member 418 as an antenna, but may be specifically for segmenting the side member 418 into a plurality of portions.

In an embodiment, the at least one slit 420 may be formed on at least one of the plurality of third surfaces 410*c* of the side member 418. According to an embodiment, two slits 420 may be formed on any one surface of the plurality of third surfaces 410*c* of the side member 418. For example, FIG. 5 illustrates that two slits 420*a* and 420*b* are formed on the upper side surface of the plurality of third surfaces 410*c* of the side member 418. According to another embodiment, differently from the illustrated embodiment, one slit 420 may be formed on one surface (e.g., the upper surface) of the plurality of third surfaces 410*c* of the side member 418, and one slit 420 may be formed on another surface (e.g., the right side surface) of the plurality of third surfaces 410*c* of the side member 418, which is adjacent thereto (hereinafter, see the embodiment of FIG. 7B). According to another embodiment, three or more slits 420 may also be formed on any one surface of the plurality of third surfaces 410*c* of the side member 418.

According to an embodiment, two slits 420*a* and 420*b* formed on one surface (e.g., the upper side surface) of the plurality of third surfaces 410*c* may be spaced apart from each other. According to an embodiment, the two slits 420*a* and 420*b* may also be formed symmetrically to each other, based on an imaginary line drawn in the height direction thereof at the center of any one surface (e.g., the upper side surface) of the plurality of third surfaces 410*c.* Still other arrangements of the positions at which the slits are formed and the gaps therebetween are within the scope of the embodiments.

According to an embodiment, the slits 420 may be provided in more than one area within one electronic device 400. For example, as illustrated in FIG. 5 and FIG. 6A, the slits 420*a* and 420*b* may be formed on an upper side surface of a plurality of surfaces of the side member 418, and additionally the slits 420*d* and 420*e* may be formed on a lower side surface of the plurality of surfaces of the side member 418. Although FIG. 5 to FIG. 6B illustrate that two slits are provided on each of the upper side surface and the lower side surface of the electronic device, the number and arrangement of slits is not limited thereto. The slits 420 according to an embodiment of the disclosure may also be implemented in the same form or may be implemented in a changed form, on the other surfaces of the plurality of third surfaces 410*c* of the side member 418, which are not mentioned. For example, as the embodiments illustrated in FIG. 7B and FIG. 8 to be described later, the at least one slit 420 may be formed on each of the upper side surface, the lower side surface, the left side surface, and the right side surface of the plurality of surfaces of the side member 418.

According to an embodiment, it should be noted that at least one slit may also be additionally or alternatively disposed at a position of the third surfaces 410*c*, which is not illustrated in the drawings. According to an embodiment, the slits 420 may be disposed and configured in a variety of ways, for example to suitably reflect the omission or addition of at least one element of a display (e.g., 201), audio modules (e.g., 203, 207, and 214), sensor modules (e.g., 204 and 219), camera modules (e.g., 205, 212, and 213), key input devices (e.g., 215, 216, and 217), an indicator (e.g., 206), or connector holes (208 and 209), and various arrangements of elements.

Referring again to FIG. 5 and FIG. 6A, according to an embodiment, the slits 420*a* and 420*b* or 420*d* and 420*e* formed in the side member 418 may be formed to be discrete and spaced apart from each other. A portion of the slits 420 may also, or alternatively, be formed in the rear plate 411. For example, referring to FIG. 6B, according to an embodiment, slits 420*c*' and 420*c*" or 420*f*' and 420*f*' formed in the rear plate 411 may be formed as one non-discrete slit of the slits 420, and slits 420*d*' and 420*e*' or 420*d*" and 420*e*" formed in the side member 418 may be formed as one non-discrete slit of the slits 420. That is, according to an embodiment, the slits 420 may also be formed over the side member 418 and the rear plate 411, and may also have a partially curved-line shape.

Referring to FIG. 6B, according to an embodiment, at least one slit 420*c*' or 420*f*, or 420*c*" or 420*f*', may be formed in the rear plate 411. According to an embodiment, at least a portion of the slit 420*c*' or 420*f*, or 420*c*" or 420*f*', formed in the rear plate 411 may also have a predetermined width, and may also extend from one portion to another portion of the rear plate 411. For example, as illustrated in FIG. 6B, at least a portion of the slit 420*c*' or 420*f*, or 420*c*" or 420*f*', may be formed to be elongated in a direction (e.g., a direction parallel to the x-axis of the spatial coordinate system) parallel to the horizontal side of the rear plate 411. According to an embodiment, the slits 420*c*' and 420*f*, or 420*c*" and 420*f*', formed in the rear plate 411 may have a continuous shape, or alternatively, may have a shape in which a portion thereof is discrete. For example, although the slits 420*c*' and 420*f*, or 420*c*" and 420*f*', illustrated in FIG. 6B have a continuous shape, they are not necessarily limited thereto. According to an embodiment, the slits 420*c*' and 420*f*, or 420*c*" and 420*f*', may also have a separate shape on the rear plate 411, or may also be formed such that the whole or at least a portion thereof is not exposed to the outside of the housing. For example, in embodiments where at least a portion of the rear plate 411 is formed of a material such as glass or synthetic resin, the slits 420*c*' and 420*f*', or 420*c*" and 420*f*", may have a separate shape, or may be formed such that the whole or at least a portion thereof is not exposed to the outside of the housing.

According to an embodiment, at least a portion of the housing 410 may be a conductive member which is formed of or otherwise includes an electrically conductive material (e.g., metal). The housing including an electrically conductive material (e.g., metal) may be configured to adjust the shape or dimension (e.g., a length, a height, or an area) thereof so as to variously form the exterior of an electronic device.

According to an embodiment, sections of the housing 410 made of an electrically conductive material (e.g., metal) may be isolated from each other through the slits 420. For example, in embodiments where at least a portion of the third surfaces 410*c* of the side member 418 is formed of a metallic material, the slits 420*a* and 420*b* may be formed on the corresponding surfaces to electrically segment a portion of the side member 418 (which may be termed a first portion) from another portion (which may be termed a second portion).

According to an embodiment, an insulating material (e.g., an injection-molded product) may be formed in a segmented portion between one portion and the other portion of the side member 418, which are formed by the slits 420. Hereinafter, an embodiment in which a side member 518 is colored in a state where at least a portion of the insulating material is formed in the segmental portion will be described in detail.

Figure 7A:
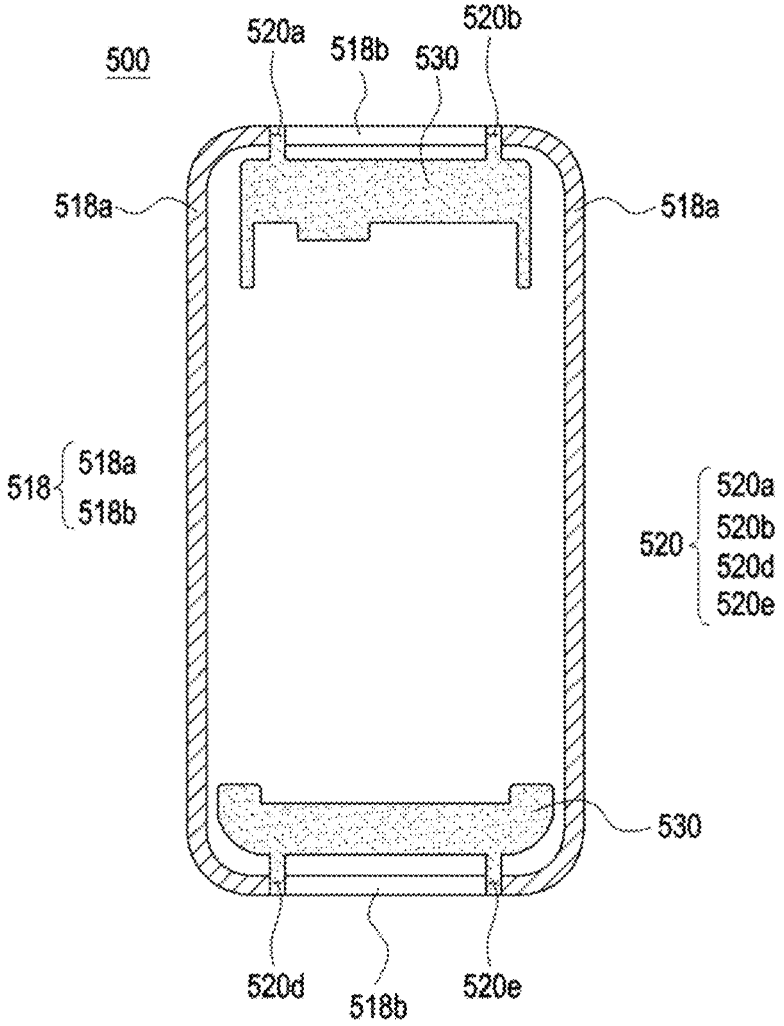
FIG. 7A is a view of a housing configuration in which a first color is applied on a segmented side member according to an exemplary embodiment.
Figure 7B:
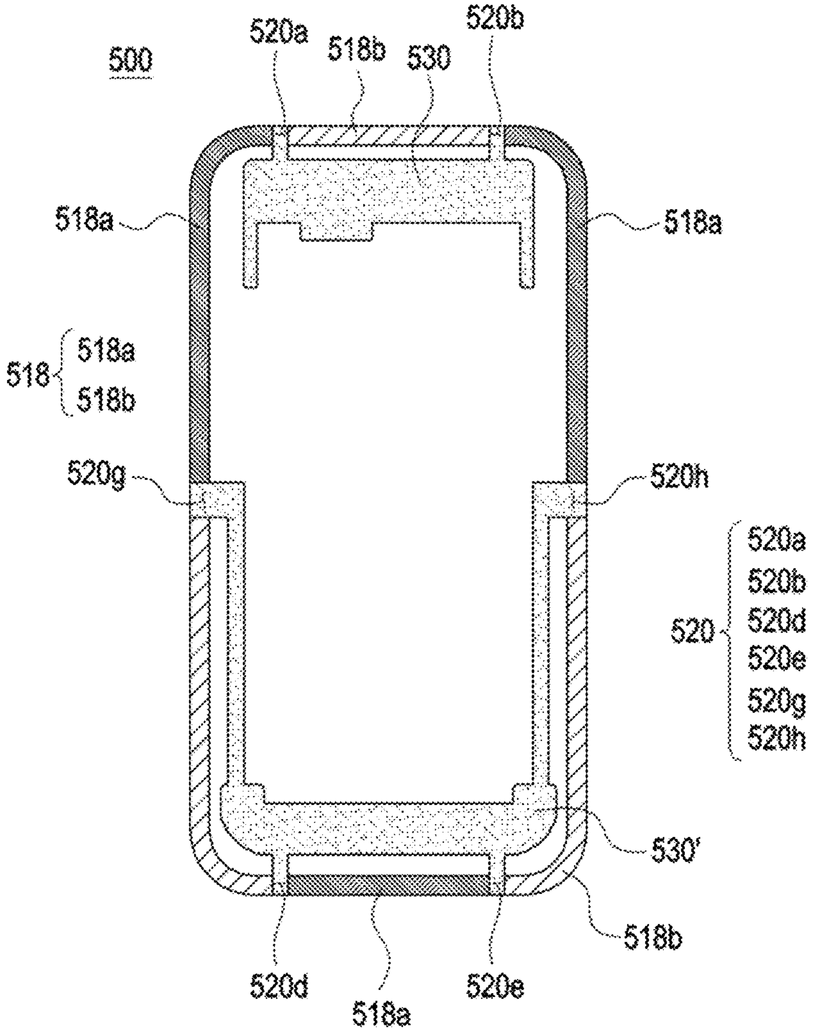
FIG. 7B is a view of a housing configuration in which a first color and a second color are applied on a segmented side member according to an exemplary embodiment.

FIG. 7A is a view of a housing configuration in which a first color is applied on a segmented side member 518 according to an exemplary embodiment. FIG. 7B is a view of a housing configuration in which a first color and a second color are applied on a segmented side member 518 according to an exemplary embodiment.

According to an embodiment, slits 520*a*, 520*b*, 520*d*, 520*e*, 520*g*, and 520*h* (e.g., the slits 420*a* and 420*b* in FIG. 5) formed on the third surfaces of the side member 518 may divide the side member 518 into two or more substantial parts. For example, in an embodiment with a side member 518 composed primarily of an electrically conductive material (e.g., metal), the side member 518 may be divided into a first portion and a second portion electrically separated from the first portion.

The housing 500 according to an embodiment may include insulating materials 530 and 530' for filling the plurality of slits formed in the side member 518 and/or the rear plate (e.g., the rear plate 411 in FIGS. 6A or 6B). The insulating materials 530 and 530' may function to limit an electric current flow between some elements and some other elements of an electronic device. For example, in an embodiment with a housing 500 composed primarily of an electrically conductive material (e.g., metal), the insulating materials 530 and 530' may cause an electrical disconnection between some elements and other elements of the housing.

Referring to FIG. 7A, the side member 518 may be divided into portions indicated by reference numeral 518*a* on the left and the right side surface thereof as a first portion, and portions indicated by reference numeral 518*b* on the upper and the lower side surface thereof as a second portion. Here, since the arrangement and shape of the first portion and the second portion indicated by reference numerals are merely examples, it should be noted that the arrangement and shape of the first portion and the second portion may be modified in various ways from the illustrated embodiment. According to an embodiment, the first portion 518*a* and the second portion 518*b* may be spaced apart by the slits 520*a*, 520*b*, 520*d*, and 520*e*, and the insulating material (e.g., an injection-molded product) 530 may be disposed in the space between the first portion 518*a* and the second portion 518*b* spaced apart from each other so as to electrically insulate the first portion 518*a* and the second portion 518*b*.

FIG. 7A illustrates an embodiment in which a first color is applied on the first portion 518*a*. According to an embodiment of the disclosure, the first portion 518*a* may include a plurality of first portions 518*a* (e.g., the first portions 518*a* respectively arranged at the left and the right side surface of the side member 518 in FIG. 7A), which are physically spaced apart from each other, and the first portions may be simultaneously colored through an anodizing process. The second portion (or the second portions) may be electrically insulated from the first portions by an insulating material 530, and thus may not be colored during the anodizing process for coloring the first portions. A plurality of first portions 518*a* may also be termed a plurality of first parts, where the first portion 518*a* includes the plurality of first parts, and likewise a plurality of second portions 518*b* may also be termed a plurality of second parts, where the second portion 518*b* includes the plurality of second parts.

The side member 518 according to the embodiment illustrated in FIG. 7B may be divided into portions indicated by reference numeral 518*a* on the left upper end, the right upper end, and the lower end thereof as a first portion, and portions indicated by reference numeral 518*b* on the left lower end, the right lower end, and the upper end thereof as a second portion. Here, the first portions 518*a* and the second portions 518*b* may be spaced apart by the slits 520*a*, 520*b* 520*d*, 520*e*, 520*g*, and 520*h*, and the insulating materials (e.g., an injection-molded product) 530 and 530' may be arranged in the space between the first portions 518*a* and the second portions 518*b* spaced apart from each other so as to electrically insulate the first portions 518*a* and the second portions 518*b*. As illustrated in FIG. 7A and FIG. 7B, the arrangement and shape of the insulating materials 530 and 530' are not limited to any specific embodiment. In addition to the embodiment illustrated in FIG. 7B, a slit may be additionally formed on the third surfaces of the side member 518, and thus the side member 518 may have a greater number of segmented pieces.

FIG. 7B illustrates an embodiment in which a first color is applied on the first portions 518*a* and a second color is applied on the second portions 518*b*. The first portions 518*a* may include a plurality of first portions 518*a* (e.g., the first portions 518*a* respectively arranged at the left upper end, the right upper end, and the lower end of the side member 518 in FIG. 7B), which are physically spaced apart from each other, and the first portions may be simultaneously colored through an anodizing process. In addition, the second portion 518*b* may include a plurality of second portions 518*b* (e.g., the second portions 518*b* respectively arranged at the upper end, the right lower end, and the left lower end of the side member 518 in FIG. 7B), which are physically spaced apart from each other, and the second portions may be simultaneously colored through an anodizing process. According to an embodiment of the disclosure, the anodizing process for the first portions and the anodizing process for the second portions may be performed continuously—that is, without substantial interruption of interim operations therebetween—and since the first portions and second portions are electrically insulated, there may be an advantage of omitting steps such as processing or cleaning performed between the anodizing processes continuously performed. Such will be described later in detail.

Figure 8:
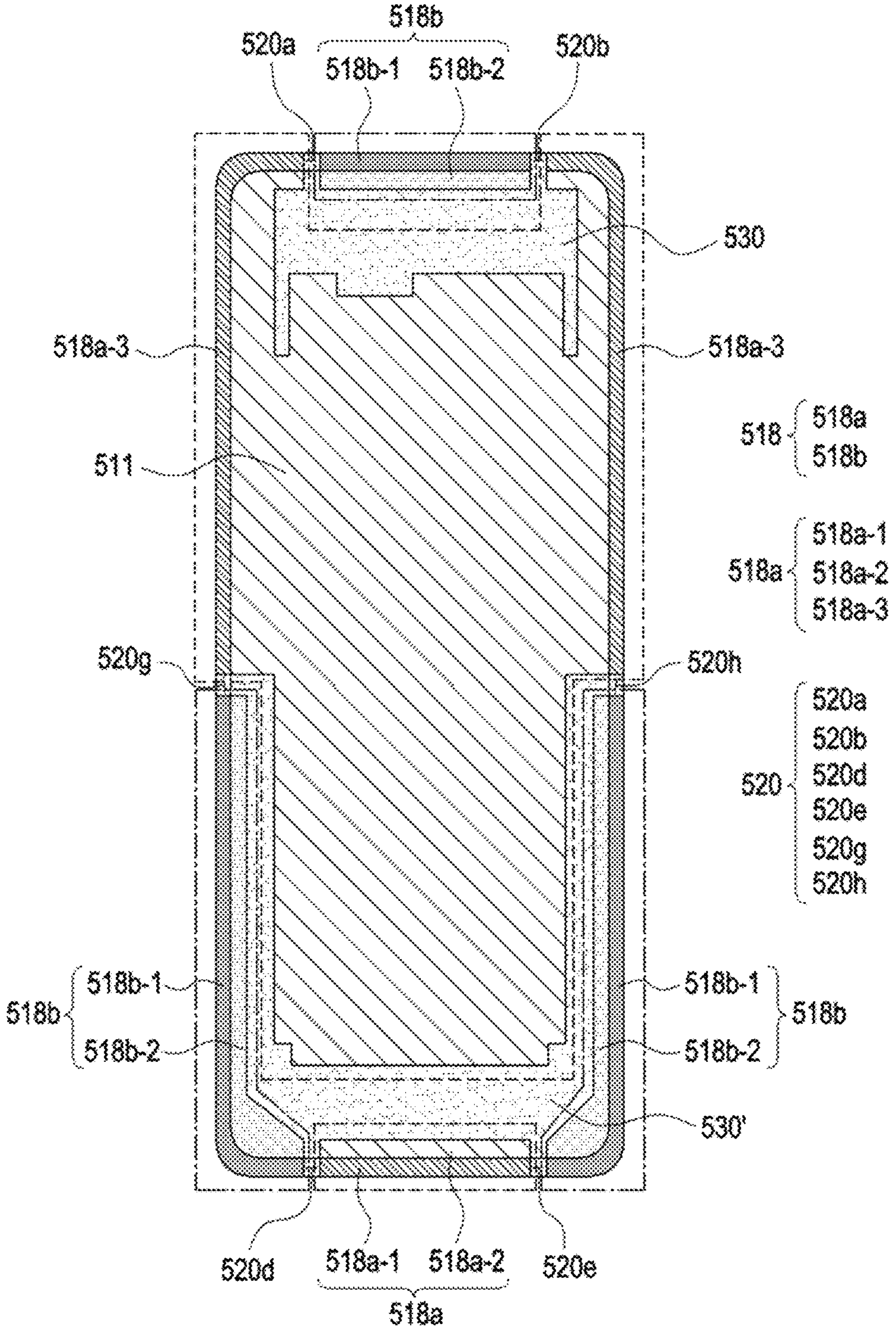
FIG. 8 is a detailed view of a housing configuration having a plurality of portions defined by one or more segmented pieces according to an exemplary embodiment.

FIG. 8 is a detailed view of a configuration for a housing 500 having a plurality of portions defined by one or more segmented pieces according to an exemplary embodiment.

Differently from the embodiments illustrated in FIG. 7A and FIG. 7B, in which only the side member 518 is colored, FIG. 8 illustrates an embodiment in which the side member 518 and the support member 511 are each colored with a designated color. Also differently from the embodiments illustrated in FIG. 7A and FIG. 7B, FIG. 8 illustrates an embodiment in which not only an outer wall 518*a*-1 or 518*b*-1 of the side member 518 but also an inner wall 518*a*-2 or 518*b*-2 of the side member 518 are colored with a designated color.

According to an embodiment of the disclosure, the housing 500 not only may include a front plate (e.g., the front plate 402 in FIG. 5), a rear plate (e.g., the rear plate 411 in FIG. 5), and a side member (e.g., the side member 418 in FIG. 5) described above in FIG. 5, but also may include a support member 511 (e.g., the support members 332 and 360 in FIG. 4) disposed in the inner space of the housing, as illustrated in FIG. 8.

The housing 500 may include an electrically conductive material, and may be divided into two or more substantial parts each of which includes an electrically conductive material. According to an embodiment, as previously described in the embodiments of FIG. 5 and FIG. 6A, the side member 518 included in the housing 500 may be divided into two or more substantial parts. Alternatively, as previously described in the embodiment of FIG. 6B, a combination of the side member 518 and the rear plate 411 included in the housing 500 may be divided into two or more substantial parts. Alternatively, a combination of the side member 518 and the support member plate 511 included in the housing 500 may be divided into two or more substantial parts.

Although embodiments of the side member 518 and/or the rear plate 411 included in the housing 500 have been described as a portion of the electronic device, they are not limited thereto, and the side member and/or the rear plate may be instead implemented as a structure attachable to or detachable from the housing 500 of the electronic device. For example, the side member 518 and/or the rear plate 411 may be coupled to the electronic device so as to protect the electronic device from external impacts or foreign substances. The housing 500 may be referred to as various terms such as "a cover", "a case", "an envelope", "an exterior case", "an accessory case", or "an enclosure". The side member 518 and/or the rear plate 411 included in the housing 500 are not limited to the embodiments disclosed herein, and may be molded into various shapes according to the shape of the electronic device.

FIG. 8 illustrates an embodiment in which the combination of the side member 518 and the support member plate 511 included in the housing 500 is divided into two or more substantial parts. The side member 518 and the support member 511 may be primarily composed of an electrically conductive material (e.g., metal). For example, the combination configuration of the side member 518 and the support member 511 may include a first portion primarily composed of an electrically conductive material, and a second portion which is primarily composed of an electrically conductive material and electrically separated from the first portion. That is, in an embodiment such as illustrated in FIG. 8, the housing 500 may include a first portion and a second portion divided as two substantial parts.

According to the embodiment illustrated in FIG. 8, the first portion may include a first side member portion 518*a* of the side member 518, and a support member 511, which may each be termed "first portions" herein. The second portion may include a second side member portion 518*b* in the side member 518, which may be termed a "second portion" herein. As illustrated in FIG. 8, uniform dashed lines define areas of the housing containing the first portions, and alternating long-and-short dashed lines define areas of the housing containing the second portion. In an embodiment, the first portion and the second portion may respectively include a plurality of first portions and a plurality of second portions. Here, the first portions 518*a* and 511 and the second portion 518*b* may be spaced apart from each other by the slits 520*a*, 520*b*, 520*d*, 520*e*, 520*g*, and 520*h*, and the insulating materials (e.g., an injection-molded product) 530 and 530' may be formed in the space formed therebetween so as to electrically insulate the first portions 518*a* and 511 from the second portion 518*b*. However, the above-described example is but one embodiment, and other embodiments are not necessarily limited thereto. For example, second portion may also be configured to include one portion of the side member 518 and at least one portion of the support member 511.

According to the embodiment illustrated in FIG. 8, a substantial part of the housing 500 may be divided into first portions 518*a* and 511 and a second portion 518*b*, and at least some of the first portions 518*a* and 511 and the second portion 518*b* may include an outer wall facing the outside of the housing and an inner wall facing a direction opposite to the outer wall. For example, the first side member portion 518*a* may include a first outer wall 518*a*-1 and a first inner wall 518*a*-2, and the second side member portion 518*b* may include a second outer wall 518*b*-1 and a second inner wall 518*b*-2. Additionally, the first portion including the support member 511 may also include, or be surrounded by, a third outer wall 518*a*-3, which may be interchangeably considered part of the first side member portion 518*a* or the support member 511. Here, the support member 511 may be configured to include an inner wall facing a direction opposite to the third outer wall 518*a*-3.

Substantial parts of the housing 500 may include, or be, a plurality of electrically separated areas. In this case, each of the areas may have different colors applied thereto; that is, each of the areas may be colored with different colors. However, it is noted that when anodizing, is performed (such as described further herein), an electric current may flow between the outer wall and the inner wall of the same segmented area (e.g., the first portion or the second portion), and thus the outer wall and the inner wall of the same segmented area (e.g., the first portion or the second portion) may be colored with the same series of colors. For example, in the illustrated configuration of FIG. 8, the first outer wall 518*a*-1 and the first inner wall 518*a*-2, as parts of the first portions, may have the same first color series applied thereto, the third outer wall 518*a*-3 and the support member 511, also as parts of the first portions, may have the same first color series applied thereto, and the second outer wall 518*b*-1 and the second inner wall 518*b*-2, as parts of the second portion, may have the same second color series applied thereto. More specifically, if the first outer wall 518*a*-1 is colored with a "RED" color, the first inner wall 518*a*-2, which is part of the same segmented area, may also be colored with the "RED" color, and if the second outer wall 518*b*-1 is colored with a "BLUE" color, the second inner wall 518*b*-2, which is part of the same segmented area, may also be colored with the "BLUE" color. In this manner, a plurality of colors may be applied to different portions of the housing.

The above is merely an example, and color application is not necessarily limited thereto. That is, as the outer wall of the housing is colored with a plurality of colors, the inner wall of the housing may also be divided into a plurality of colors which differ from corresponding portions of the outer wall. According to an embodiment, the outer wall and the inner wall of the same segmented area (e.g., of a first portion or of a second portion) may have a difference in color according to a surface state (e.g., roughness or gloss) for each area, or according to a post-treatment process. For example, the first outer wall 518*a*-1 may be colored with a "deep RED" color, while the first inner wall 518*a*-2, which is part of the same segmented area, may be colored with a "light RED" color. As another example, the third outer wall 518*a*-3 may be colored with a "deep RED" color, while the support member 511, which is part of the same segmented area, may be colored with a "light RED" color. As yet another example, the second outer wall 518*b*-1 may be colored with a "deep BLUE" color, while the second inner wall 518*b*-2, which is part of the same segmented area, may be colored with a "light BLUE" color.

In an embodiment of the disclosure, the first outer wall 518*a*-1, the second inner wall 518*a*-2, the third outer wall 518*a*-3, and the support member 511 of a first portion (e.g. first portions 518*a* and 511) may be colored with a first series of colors through a primary anodizing process, and the second outer wall 518*b*-1 and the second inner wall 518*b*-2 of a second portion (e.g. second portion 518*b*) may be colored with a second series of colors through a secondary anodizing process continuously performed following the primary anodizing process. According to an embodiment of the disclosure, in order to enhance the aesthetic beauty of the exterior thereof, the outer wall may be thereby colored with various colors, and furthermore, the inner wall may also be colored with various colors.

In summary, in an embodiment of the disclosure, the outer wall (e.g., the first outer wall 518*a*-1 and third outer wall 518*a*-3) of the first portion (e.g. first portions 518*a* and 511) may be formed to have a (1-1)th color, the inner wall (e.g., the first inner wall 518*a*-2 and/or the support member 511) of the first portion (e.g. first portions 518*a* and 511) may be formed to have a (1-2)th color, the outer wall (e.g., the second outer wall 518*b*-1) of the second portion (e.g. second portion 518*b*) may be formed to have a (2-1)th color, and the inner wall (e.g., the second inner wall 518*b*-2) of the second portion (e.g. second portion 518*b*) may be formed to have a (2-2)th color. According to an embodiment, the (1-1)th color and the (1-2)th color may be the same series of first colors, and the (2-1)th color and the (2-2)th color may also be the same series of second colors. According to an embodiment, the (1-1)th color and the (1-2)th color may be formed as the same series of the first colors through a primary anodizing process, and the (2-1)th color and the (2-2)th color may be formed as the same series of the second colors through a secondary anodizing process. However, the embodiments of the disclosure are not limited thereto. The (1-1)th color, the (1-2)th color, the (2-1)th color, and the (2-2)th color may also be different colors according to a surface state (e.g., roughness or gloss) for each area, or according to a post-treatment process. For example, the (1-1)th color, the (1-2)th color, the (2-1)th color, and the (2-2)th color may be four colors different from each other, applied through four respective anodizing processes. In addition, other an embodiment may be applied.

Hereinafter, a housing structure manufacturing method including an anodizing process will be described in detail with reference to FIG. 9A to FIG. 13.

Figure 9A:
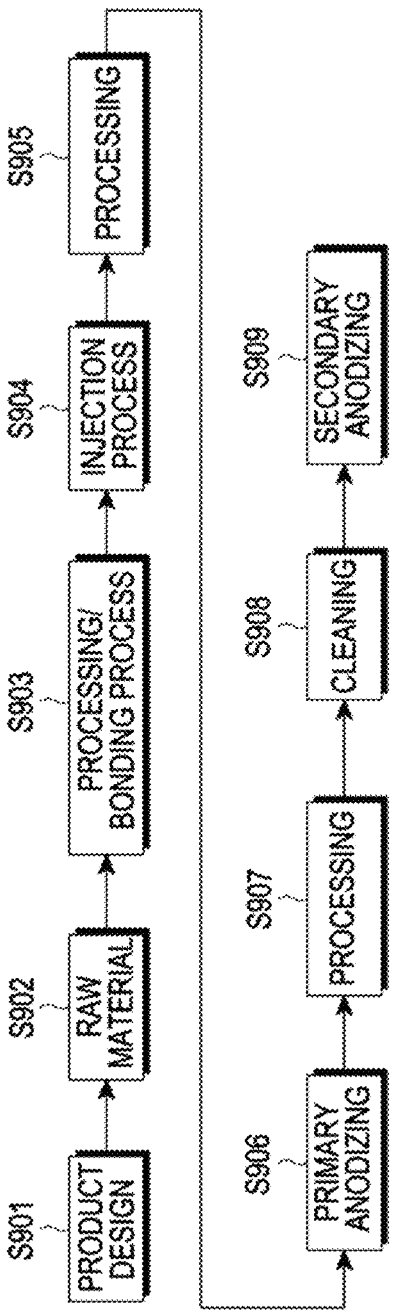
FIG. 9A is a flowchart illustrating a housing structure manufacturing method including an anodizing process according to an exemplary embodiment.
Figure 9B:
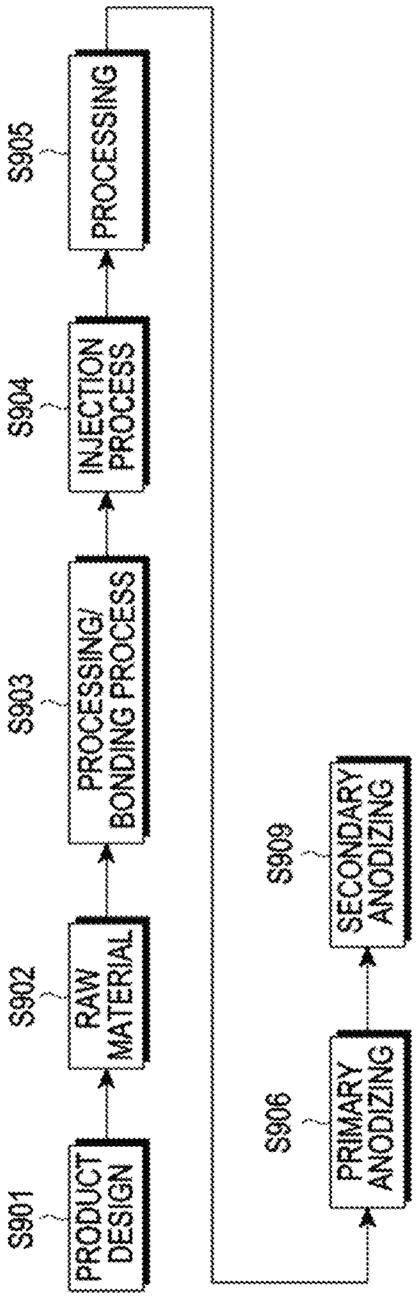
FIG. 9B is a flowchart illustrating a housing structure manufacturing method including an anodizing process according to another exemplary embodiment.

FIG. 9A is a flowchart illustrating a housing structure manufacturing method including an anodizing process according to an exemplary embodiment. FIG. 9B is a flowchart illustrating a housing structure manufacturing method including an anodizing process according to another exemplary embodiment.

First, in operation S901, a design for a product to be produced—for example, the appearance and shape of the product—is determined. The design of the exterior to be implemented, including a total number of colors to be expressed on the exterior, and specific colors and locations at which the colors are to be arranged, may be determined. On this basis, a section in which a synthetic resin (e.g., resin) and an electrically conductive material (e.g., metal) (hereinafter, "a metal member") are to be arranged may be selected.

Next, in operation S902, a raw material for the housing, which includes a metal member, may be provided. For example, an aluminum plate material for use as an exterior material or an interior material of an electronic device may be the raw material of the housing. For example, the aluminum plate material may include any of a 2xxx-series alloy to a 6xxx-series alloy. The aluminum plate material may also include a 7xxx-series alloy having high strength. An aluminum alloy material may include aluminum as a main component thereof, and may include copper, magnesium, manganese, silicon, tin, or zinc as a main alloying element thereof.

Next, in operation S903, a cutting processing and bonding process of the raw material of the housing, which includes the metal member, may be performed. The housing may be manufactured in a desired shape through a cutting processing process. The metal member which has been subjected to the cutting processing process may also be subjected to a bonding process, which may be any suitable chemical and/or physical treatment process or combination of processes which enable a metal and a molten resin injected in an injection process (described below) to be bonded to each other. Such a bonding treatment may reduce risk of the metal member being broken or spaced apart during the injection process, due to an insufficient bonding property with the injection resin.

Next, in operation S904, a molten resin may be injected into the metal member through an injection process so as to bond the resin and the metal.

In operation S905, the metal member may be processed into a desired final shape through a processing process. Here, the processing process may include both a polishing (wet and dry polishing) process and Dia-Cut processing which may be involved in the final appearance of the exterior material, in addition to a simple cutting process. According to an embodiment, the polishing process may be performed to implement high gloss on the surface of the metal member to be applied to the electronic device, and may include a physical polishing (dry/wet polishing) process and/or an electro polishing process. In the polishing process, an electro polishing process may be performed either before or after a physical polishing process. Additionally, one or both of a physical polishing process and an electro polishing process may be selectively performed.

For example, physical polishing may be performed by touching a rotating polishing device onto the surface of the metal member. The physical polishing process may selectively include at least one of a wet polishing in which the surface of the metal member is polished in a wet state and a dry polishing in which the surface of the metal member is polished in a dry state. The electro polishing process may use an anodic dissolution phenomenon to smooth and/or polish the surface of the metal member.

According to an embodiment, after the polishing process (for example, the physical polishing process and/or the electro polishing process) is performed, a surface curve forming process may be performed. The surface curve forming process may be performed after one of a physical polishing process or an electro polishing process is performed, after a physical polishing process and an electrolytic process are sequentially performed, or in a state where no polishing process is performed. According to an embodiment, the surface curve forming process may be performed in order to implement a curve (e.g., roughness) on the surface of the metal member to be applied to the electronic device, and may include a method of physically applying force such as sandblasting, and/or a method of chemically applying force such as chemical etching. In addition, the processing process may include all the processes, such as barrel polishing, sand blasting, and hairline, which are involved in an appearance thereof.

In operation S906 and operation S909, an anodizing process may be performed. In detail, the anodizing process may include a pre-treatment step (cleaning), an anode oxide film formation step (or an anodizing step), a dyeing step, and/or a post-treatment step (or a sealing step).

The pre-treatment step may include a degreasing process, a chemical polishing process, and a de-smut process. In this case, in the degreasing process, an acidic or a neutral degreasing solution may be selectively applied according to a process environment and a target material. The chemical polishing process may be performed to flatten an uneven surface of a material, which is non-uniformly treated, so as to reduce diffuse reflection and improve surface gloss thereof. The de-smut process may be performed to remove smut and foreign substances on the surface of a material, which have been generated during the degreasing process and the chemical polishing process. In this manner, the surface of the metal member may be provided with a predetermined level of glossiness and flatness.

Next, the surface of a metal exterior material may be anodized. The anode oxide film formation step may be performed in a state of putting the housing including the metal member in a container in which at least one electrolyte among sulfuric acid, oxalic acid, phosphoric acid, chromic acid, organic acid (citric acid, acetic acid, propionic acid, tartaric acid), or boric acid, or an electrolyte including all thereof is received, and applying a predetermined voltage and temperature thereto. In the anode oxide film formation step, since a voltage is applied to the metal member, the metal member may react with oxygen so that an oxide film having high density is formed. For example, a working voltage within the range of about 5-20V may be applicable, and the process time may take about 10 minutes to 3 hours. The process temperature within the entire range of about 5-30° C. may be applicable. The primary anodizing S906 may thereby form a first oxide film, and the secondary anodizing S909 may thereby form a second oxide film.

After the anodizing step, a dyeing process may be performed. The dyeing process may be a process of expressing color on the anodized oxide film. Suitable dyeing processes include, but are not limited to, immersion, electrolytic dyeing, and oil-based dyeing. An immersion process immerses a product into a solution in which a dye is dissolved. such that the dye is diffused and adsorbed into the product in order to apply a color. An electrolytic dyeing applies an electric current in a metal salt electrolyte or the like to express a color. An oil-based dyeing photosensitizes and dries an oxide film, and then colors same with an oil-based dye by using a brush. Here, a dye used in an immersion process may include both an organic dye and an inorganic dye, and an immersion method may also be called as an aqueous method since the dyes used in an immersion method are mainly soluble in water. The primary anodizing S906 may thereby color the first oxide film with a first color or color series, and the secondary anodizing S909 may thereby color the second oxide film with a second color or color series.

Next, in the post-treatment step, a film sealing treatment and a post-sealing treatment may be performed. The sealing treatment may include both a treatment method using metal salts and a treatment method using non-metal salts made of an organic matter. A hydration sealing treatment using water and steam may be included therein. The post-sealing treatment may include an elution process for removing metal salts or a hot water cleaning process for cleaning foreign substances. The post-treatment steps may be performed to secure the exterior stability and reliability of the anodized and colored material. In this manner, the performance and properties of the colorants of the oxide films may be maintained.

According to the embodiment illustrated in FIG. 9A, between the two anodizing processes according to operation S906 and operation S909, a processing operation S907 and a cleaning operation S908 may be performed. The processing operation S907 may be an operation of, when the color according to the anodizing process of operation S906 is colored thereon, cutting and processing same, or of polishing the oxide film generated in the anodizing step to remove the primary anodized film, in a section where different color coloring is required. A cleaning operation S908 may be an operation of removing processing by-products (e.g., cutting oils, processing burrs, and other foreign substances) generated in the processing operation S907 to clean a surface on which the process of a secondary anodizing S909 is to be performed.

According to an embodiment of the disclosure illustrated in FIG. 9B, between the two anodizing processes according to operation S906 and operation S909, the processing operation S907 and the cleaning operation S908 may be omitted. That is, the primary anodizing process S906 and the secondary anodizing process S909 may be continuously performed, without interruption of the intermediate processing step and the cleaning step. Accordingly, multi-coloring is possible even having a reduced number of processes so that the cost is saved and the productivity thereof is improved. According to an embodiment of the disclosure, a continuous anodizing process may be a process of continuously performing anodizing processes, one after the other without substantial interruption, once for each of the colors to be applied. The continuous anodizing process may include not only the primary and secondary anodizing but also a tertiary anodizing process or more anodizing processes.

Figure 10A:
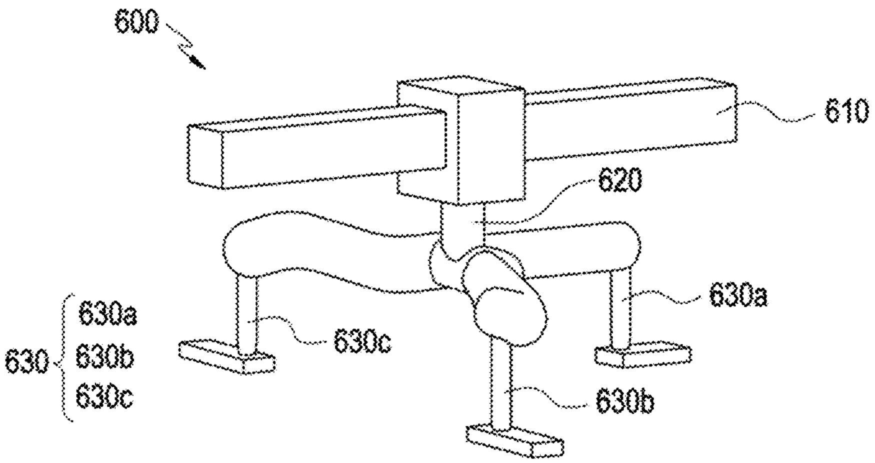
FIG. 10A is a perspective view of a jig used for performing an anodizing process according to an exemplary embodiment.
Figure 10B:
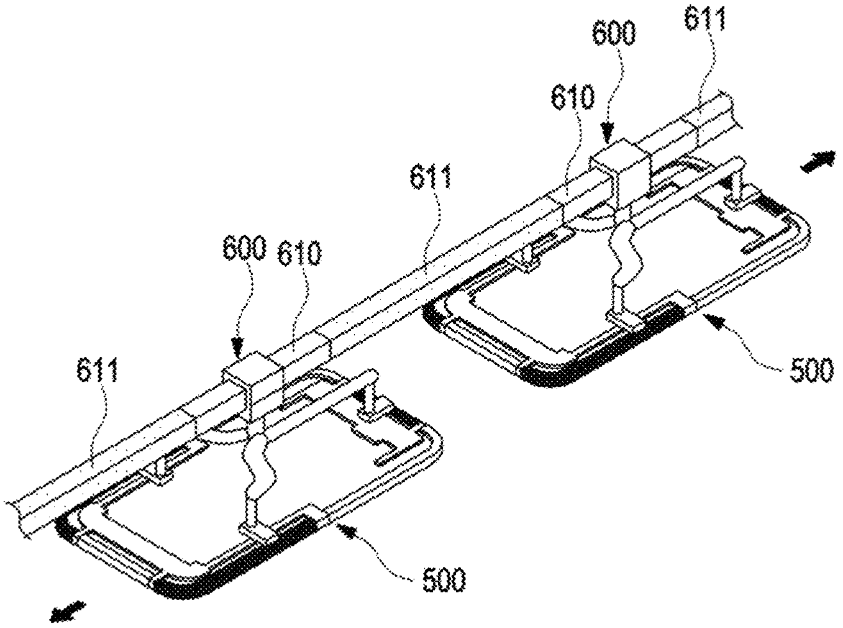
FIG. 10B illustrates a use aspect of a jig used for performing an anodizing process according to an exemplary embodiment.
Figure 11:
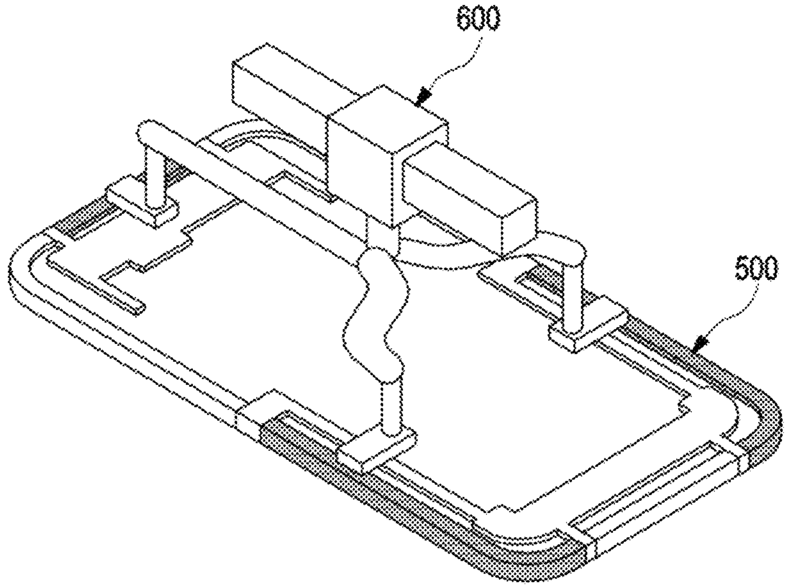
FIG. 11 illustrates a jig mounted to a housing according to an exemplary embodiment.

FIG. 10A is a perspective view of a jig used for performing an anodizing process according to an exemplary embodiment. FIG. 10B illustrates a use aspect of a jig used for performing an anodizing process according to an exemplary embodiment. FIG. 11 illustrates a jig mounted to a housing 500 according to an exemplary embodiment.

A jig 600 may be provided to allow an electric current to flow through a metal member so as to generate an oxide film on the surface of the metal member. When anodizing is performed, an oxide film may be generated only on the surface of a metal member to which the jig 600 is connected, and thus through which an electric current flows, such that an oxide film would not be formed on a metal member separated by an insulating material. In a dyeing operation after the oxide film is formed, only the surface of a metal member, to which the jig 600 is connected, may be colored.

The jig 600 used here may include jigs which are made of metal materials enabling an electric current flow, and which have shapes allowing the jig 600 to be stably mounted to a product, in an anodizing process. For example, FIG. 10A illustrates the jig 600 including a shaft 620, a connection member 610 provided at one end of the shaft 620, and a plurality of branches 630*a*, 630*b*, and 630*c* formed at the other end of the shaft 620. Although the drawings illustrate a jig having three branches, it is not limited thereto, and any suitable type of jig may be included in various embodiments. The jig may also be a jig capable of being inserted into a through-hole formed through the housing, a jig brought into close contact with the surface of the housing so as to press the housing, or a jig caught on and fixed to a concave/convex part formed on the housing.

Referring to FIG. 10B, the jig 600 may perform a series of anodizing processes together with another jig 600 by using the connection member 610. For example, the connection member 610 of each jig 600 may be connected and mounted to a rod part 611 for transporting the jig 600 in one or the other direction. According to an embodiment, the connection member 610 may also be formed integrally with the rod part 611. An anodizing method of the disclosure may be thereby applied to a plurality of housings 500 through the jig 600.

Referring to FIG. 11, in order to apply a plurality of colors, the jig may be connected to a new surface of a metal member, which is not anodized, by changing a position of the housing 500 to which the jig 600 is mounted—that is, a position in which the jig 600 is supported by the housing 500—and thus additional anodizing and coloring processes may be performed.

FIGS. 12A-12E illustrate an application of an example housing coloration by a continuous anodizing process according to an exemplary embodiment.

Figure 12A:
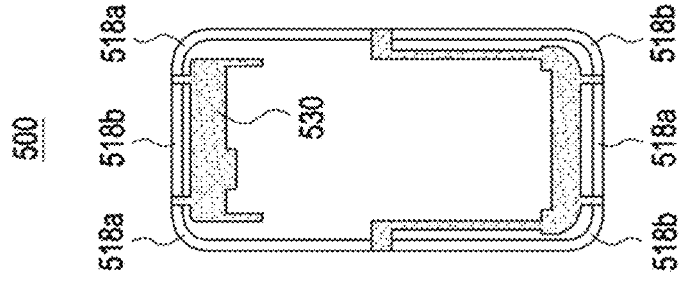
FIGS. 12A-12E illustrate an application of an example housing coloration by a continuous anodizing process according to an exemplary embodiment.
Figure 12B:
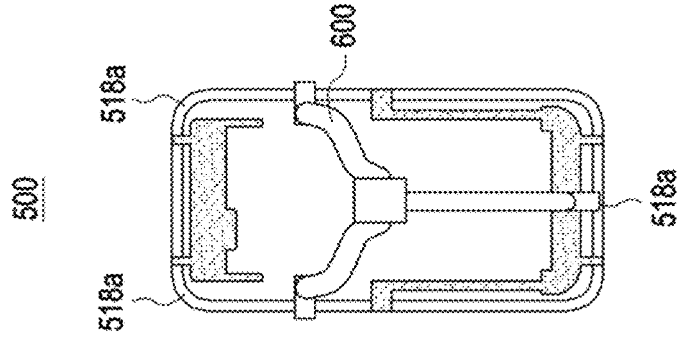
Figure 12C:
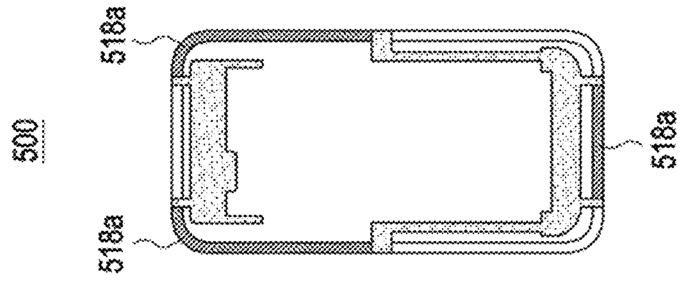
Figure 12D:
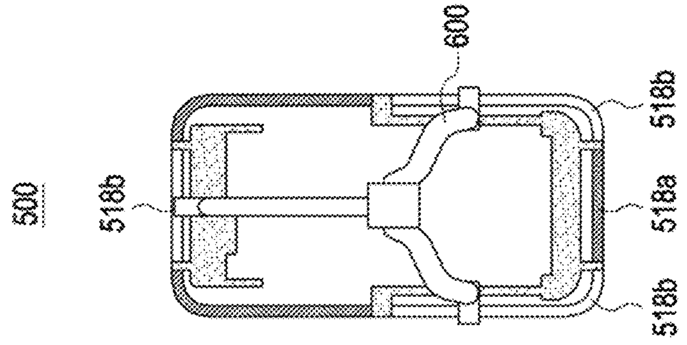
Figure 12E:
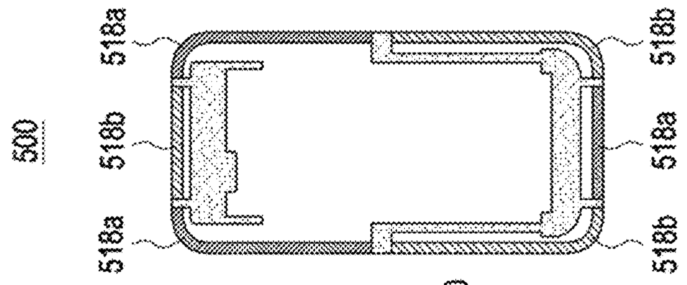

According to an embodiment of the disclosure, the branch of the jig 600 may be selectively connected specifically to a designated electrically conductive material portion or portions of a housing 500, from among areas composed primarily of an electrically conductive material which are divided from each other by an insulating material, such that the designated electrically conductive material portion is anodized and colored. For example, as illustrated in FIG. 12A to FIG. 12C, in the primary anodizing process, the jig 600 may be connected to one or more first portions 518*a* of the side member 518. As a result of the primary anodizing process, only the surface of the metal member to which the jig 600 is connected may be colored with a designated color. In order to perform additional coloring, as illustrated in FIGS. 12D to 12E, the jig 600 may be connected to one or more second portions 518*b*, which are not yet anodized, so as to perform the secondary anodizing process and coloring process. In this way, a desired color may be applied in various ways for each section through the anodizing processes being continuously performed. In this way, multi-layered colors may be applied by repeating the anodizing processes for each desired color.

FIGS. 12A-12E illustrate that the three branches of the jig 600 are respectively connected to each of the three first portions 518*a*, and then to each of the three second portions 518*b*. However, other embodiments and implementations are not necessarily limited thereto. For example, if two of the first portions 518*a* are connected to an electrically conductive material (not shown) (e.g., aluminum) included in an injection molded product, and thus form a single electrical conductor, the anodizing and coloring process for the first portions 518*a* may be performed using two branches of the jig 600.

Figure 13:
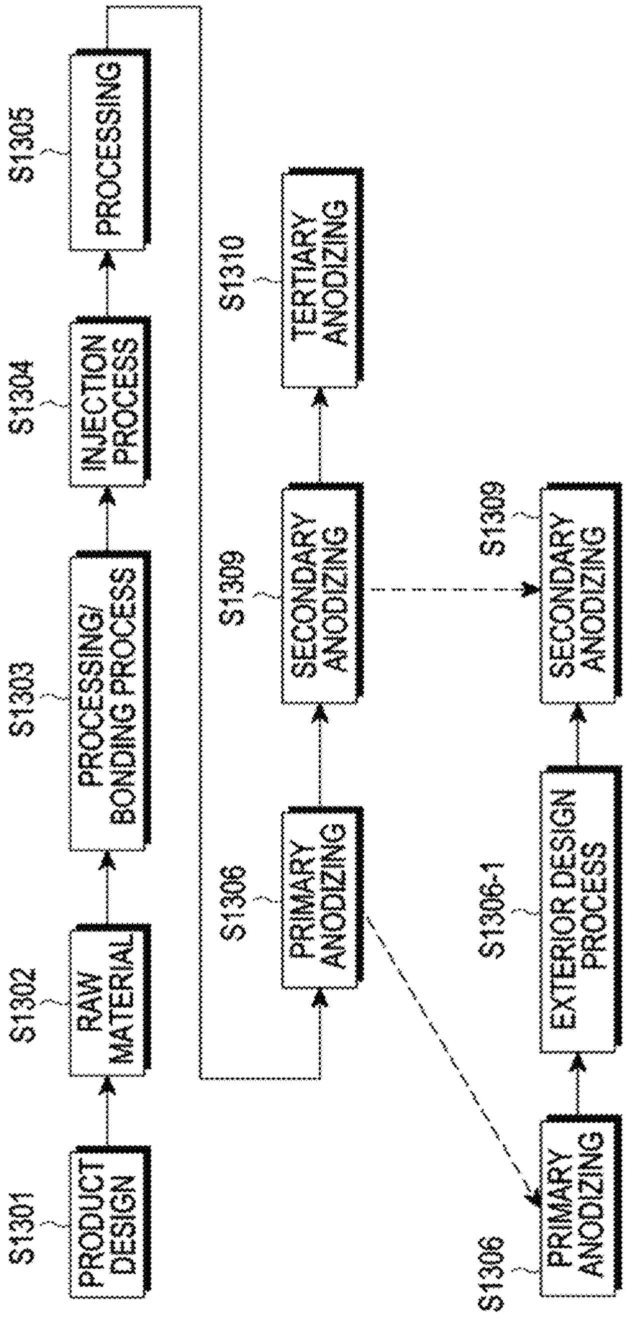
FIG. 13 is a flowchart illustrating a housing structure manufacturing method including a continuous anodizing process according to another exemplary embodiment.

FIG. 13 is a flowchart illustrating a housing structure manufacturing method including a continuous anodizing process according to another exemplary embodiment.

According to an embodiment, through a continuous anodizing process, the colors of the divided metal member (e.g., of a first portion and of a second portion) may be applied according to a desired design, and various textures as well as various colors may be applied to each of the sections segmented by the slits. For example, barrel polishing, wet/dry polishing, blasting, or hairline processes, which are involved in the appearance thereof, may be performed between the anodizing processes, so that different textures for the segmented sections of a metal member are applied. In this manner, even if the same processes are applied to one product, different textures may be applied to the segmented sections of the metal member because the effects, which are implemented on a surface to which anodizing is applied and a surface to which anodizing is not applied, are different.

Therefore, according to the embodiment illustrated in FIG. 13, a method includes operations S1301 through S1309. These operations are comparable to operations S901 through S909 and, therefore, their descriptions will not be repeated. Additionally, an exterior design operation S1306-1 may occur between the primary anodizing S1306 and the secondary anodizing S1309, this operation applying the different textures to segmented sections in, for example, the manner described above.

Further, a tertiary anodizing S1310 may occur after the secondary anodizing S1309, with or without another exterior design operation therebetween.

Figure 14:
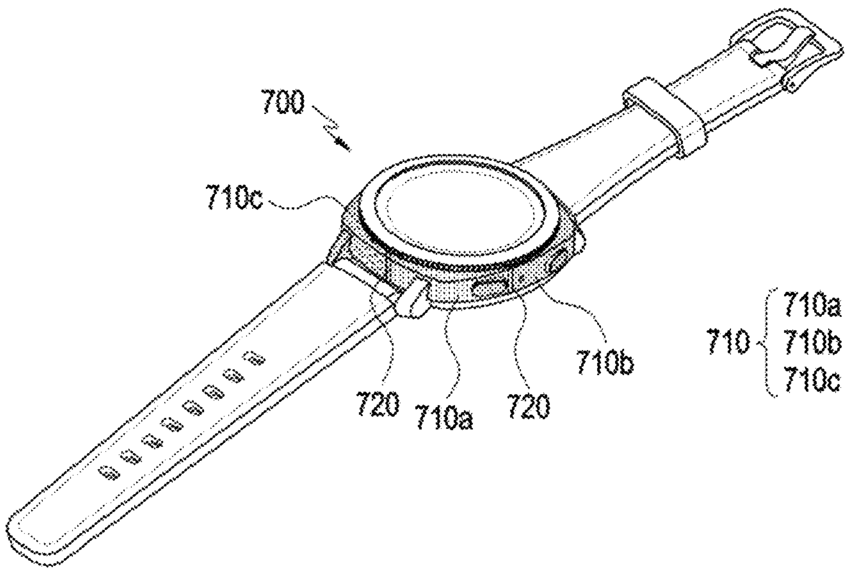
FIG. 14 is a perspective view of a wearable electronic device having a housing, the exterior of which is colored by various colors by a continuous anodizing method, according to an exemplary embodiment.
Figure 15:
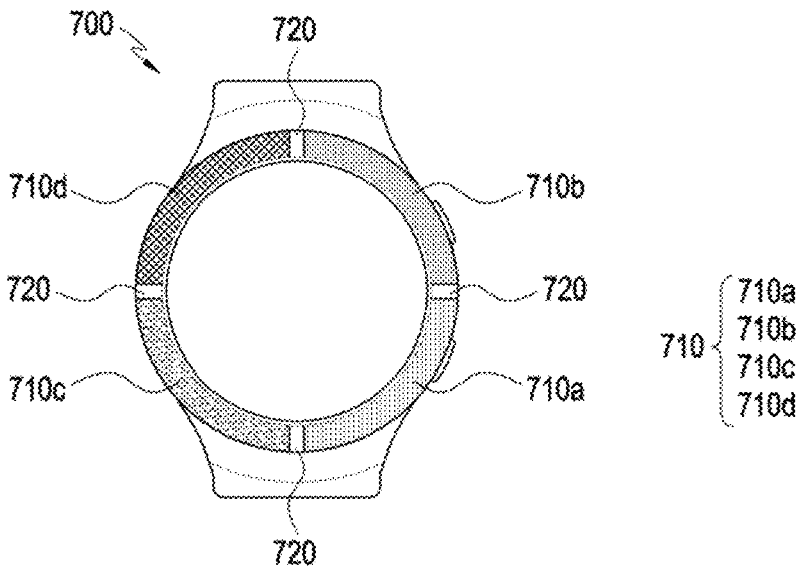
FIG. 15 is a front view of a wearable electronic device having a housing, the exterior of which is colored by various colors by a continuous anodizing method, according to an exemplary embodiment.

FIG. 14 is a perspective view of a wearable electronic device 700 having a housing, the exterior of which is colored by various colors by a continuous anodizing method, according to an exemplary embodiment. FIG. 15 is a front view of a wearable electronic device having a housing, the exterior of which is colored by various colors by a continuous anodizing method, according to an exemplary embodiment.

The housing and the housing manufacturing method according to an embodiment of the disclosure may be applicable to a variety of product groups using metal as an exterior material thereof, and is not limited to an outer frame of portable terminals such as illustrated in FIG. 2 to FIG. 13.

For example, as illustrated in FIG. 14, a wearable electronic device 700 may be formed to have an insulating material at a segmented portion which is between first and second portions of a side member and which is formed by at least one slit 720. The at least one slit 720 may divide the housing (e.g., a side member) into two or more substantial parts. For example, if the housing of the wearable electronic device is made of an electrically conductive material (e.g., metal), an insulating material may be used to cause an electrical disconnection between individual elements of the housing. The two or more electrically insulated substantial parts may have different colors applied thereto by using a continuous anodizing method.

For example, according to the embodiments illustrated in FIG. 14 and FIG. 15, a housing 710 (e.g., a side member) may be divided into a first portion 710*a*, a second portion 720*b*, a third portion 720*c*, and a fourth portion 720*d* as four substantial parts. According to an embodiment, the first portion 710*a*, the second portion 720*b*, the third portion 720*c*, and the fourth portion 720*d* may have different colors applied thereto, and in order to implement the housing 710, a housing structure manufacturing method including the anodizing process, such as described above in any of FIGS. 9A, 9B, and 13, may be applied thereto.

A housing with the properties disclosed herein may also be manufactured and colored for use with still other suitable devices, including but not limited to those identified elsewhere herein.

A housing structure of an electronic device is not limited by the above-described embodiments and drawings, and it will be obvious to a person skilled in the technical field to which the disclosure belongs that various substitutions, modifications, and changes are possible within the technical scope.

What is claimed is:

1. An electronic device comprising a housing,
wherein a portion of the housing is a conductive member formed of an electrically conductive material,
wherein the conductive member is divided into a first portion and a second portion,
wherein the first portion and the second portion are electrically separated by an insulating material disposed between the first portion and the second portion,
wherein a first oxide film is formed on a surface of the first portion by a primary anodizing process in which electricity is applied to the first portion, and the first oxide film is colored in a first color,
wherein a second oxide film is formed on a surface of the second portion by a secondary anodizing process in which electricity is applied to the second portion, and the second oxide film is colored in a second color, and
wherein the second color is different from the first color.

2. The electronic device of claim 1, wherein the housing comprises:
a front plate,
a rear plate facing in a direction opposite to the front plate,
a side member surrounding a space between the front plate and the rear plate, and
a support member disposed in the space; and
wherein the conductive member comprises the side member.

3. The electronic device of claim 2, wherein the conductive member further comprises the rear plate.

4. The electronic device of claim 2, wherein the conductive member further comprises the support member.

5. The electronic device of claim 1, wherein each of the first portion and the second portion comprises an outer wall facing an outside of the housing and an inner wall facing in a direction opposite to the outer wall.

6. The electronic device of claim 5, wherein the outer wall of the first portion is colored with a (1-1)th color, the inner wall of the first portion is colored with a (1-2)th color, the outer wall of the second portion is colored with a (2-1)th color, and the inner wall of the second portion is colored with a (2-2)th color.

7. The electronic device of claim 5, wherein the outer wall of the first portion and the inner wall of the first portion are colored by a first color series using the primary anodizing process, and the outer wall of the second portion and the inner wall of the second portion are colored by a second color series using the secondary anodizing process which is continuously performed following the primary anodizing process.

8. The electronic device of claim 1, wherein the first portion comprises a plurality of first parts physically spaced apart from each other.

9. The electronic device of claim 1, wherein the second portion comprises a plurality of second parts physically spaced apart from each other.

10. The electronic device of claim 1, wherein the first portion and the second portion are electrically segmented by at least one slit.

11. The electronic device of claim 10, wherein the insulating material is filled in the at least one slit.

12. A housing manufacturing method comprising:
providing a housing which comprises a conductive member, the conductive member comprising a first portion and a second portion, wherein the first portion and the second portion are electrically separated by an insulating material disposed between the first portion and the second portion;

primary anodizing the first portion of the conductive member by applying electricity to the first portion to form a first oxide film on the first portion;

coloring the first oxide film by using a colorant having a first color;

secondary anodizing the second portion of the conductive member by applying electricity to the second portion to form a second oxide film on the second portion; and coloring the second oxide film by using a colorant having a second color, wherein the second color is different from the first color.

13. The housing manufacturing method of claim 12, further comprising pre-treating a surface of the conductive member to be provided a predetermined level of glossiness and flatness before the primary anodizing.

14. The housing manufacturing method of claim 12, further comprising sealing to maintain performance and properties of the colorants on the first oxide film and the second oxide film after the primary anodizing and the secondary anodizing.

15. The housing manufacturing method of claim 12, wherein the conductive member comprises an aluminum alloy.

16. A housing for an electronic device comprising a conductive member formed of an electrically conductive material, wherein the conductive member is divided into a first portion and a second portion, wherein the first portion and the second portion are electrically separated by an insulating material disposed between the first portion and the second portion, wherein a first oxide film is formed on a surface of the first portion by a primary anodizing process in which electricity is applied to the first portion, and the first oxide film is colored in a first color, wherein a second oxide film is formed on a surface of the second portion by a secondary anodizing process in which electricity is applied to the second portion, and the second oxide film is colored in a second color, and wherein the second color is different from the first color.

17. The housing of claim 16, further comprising:

a front plate;

a rear plate facing in a direction opposite to the front plate; and a side member surrounding a space between the front plate and the rear plate, wherein the conductive member comprises the side member.

18. The housing of claim 16, wherein each of the first portion and the second portion comprises an outer wall facing an outside of the housing and an inner wall facing in a direction opposite to the outer wall, and wherein the outer wall of the first portion is colored with a (1-1)th color, the inner wall of the first portion is colored with a (1-2)th color, the outer wall of the second portion is colored with a (2-1)th color, and the inner wall of the second portion is colored with a (2-2)th color.

19. The housing of claim 16, wherein the first portion is colored by a first color series using the primary anodizing process, and the second portion is colored by a second color series using the secondary anodizing process which is continuously performed following the primary anodizing process.

20. The housing of claim 16, wherein the first portion and the second portion are electrically segmented by at least one slit, wherein the insulating material is filled in the at least one slit.

* * * * *